US012691641B2

(12) United States Patent
Jones et al.

(10) Patent No.: US 12,691,641 B2
(45) Date of Patent: Jul. 28, 2026

(54) 3D PRINTING AND MEASUREMENT APPARATUS AND METHOD

(71) Applicant: Markforged, Inc, Watertown, MA (US)

(72) Inventors: Bruce David Jones, Sudbury, MA (US); Corey Hazeltine Walsh, Boston, MA (US); Yongquan Lu, Cambridge, MA (US); Maggie Su, Somerville, MA (US)

(73) Assignee: Markforged, Inc., Waltham, MA (US)

( * ) Notice: Subject to any disclaimer, the term of this patent is extended or adjusted under 35 U.S.C. 154(b) by 0 days.

(21) Appl. No.: 17/828,611

(22) Filed: May 31, 2022

(65) Prior Publication Data

US 2022/0288866 A1 Sep. 15, 2022

Related U.S. Application Data

(62) Division of application No. 16/876,496, filed on May 18, 2020, now Pat. No. 11,383,451.

(Continued)

(51) Int. Cl.
*B29C 64/393* (2017.01)
*B29C 64/135* (2017.01)
(Continued)

(52) U.S. Cl.
CPC .......... *B29C 64/393* (2017.08); *B29C 64/135* (2017.08); *B33Y 50/02* (2014.12);
(Continued)

(58) Field of Classification Search
CPC ..... B29C 64/393; B29C 64/135; B33Y 50/02; G06F 30/20; G05B 19/4099; G05B 2219/49013; G05B 2219/49023
See application file for complete search history.

(56) References Cited

U.S. PATENT DOCUMENTS 9,149,988 B2 10/2015 Mark et al.
9,186,846 B1 11/2015 Mark et al.
(Continued)

FOREIGN PATENT DOCUMENTS

CN 106216678 A 12/2016
EP 3549747 A1 10/2019
(Continued)

OTHER PUBLICATIONS

Search Report dated Oct. 8, 2020, in European Patent Application No. 20175191.4.

(Continued)

*Primary Examiner* — Robert E Fennema
*Assistant Examiner* — Yvonne Trang Follansbee
(74) *Attorney, Agent, or Firm* — PEARL COHEN LLP

(57) ABSTRACT

A method of 3D printing an object includes receiving design information corresponding to an object for which a printed object is to be generated by a 3D printing operation according to a first set of print instructions, generating a plurality of measurement locations, printing successive layers which form the object, measuring the object at the measurement locations to form measurement data, comparing the measurement data with expected measurements of the measurement locations based on the design information, and generating, based on the comparing, deviation information. The measurement locations represent locations of the object to be measured by a measurement device. The deviation information represents deviations between the printed object following completion of the printing, and the object represented by the design information.

7 Claims, 29 Drawing Sheets

Related U.S. Application Data

(60) Provisional application No. 62/849,432, filed on May 17, 2019.

(51) Int. Cl.
    B33Y 50/02         (2015.01)
    G05B 19/4099    (2006.01)
    G06F 30/20       (2020.01)

(52) U.S. Cl.
    CPC ......... G05B 19/4099 (2013.01); G06F 30/20 (2020.01); G05B 2219/49013 (2013.01); G05B 2219/49023 (2013.01)

(56) References Cited

U.S. PATENT DOCUMENTS

| | | | |
|---|---|---|---|
| 9,370,896 | B2 | 6/2016 | Mark |
| 9,539,762 | B2 | 1/2017 | Durand et al. |
| 9,579,851 | B2 | 2/2017 | Mark et al. |
| 9,694,544 | B2 | 7/2017 | Mark et al. |
| 10,000,011 | B1 | 6/2018 | Mark |
| 10,076,876 | B2 | 9/2018 | Mark et al. |
| 10,464,131 | B2 | 11/2019 | Mark |
| 10,960,608 | B2 | 3/2021 | Yorozu |
| 2004/0005182 | A1* | 1/2004 | Gaylo ................... B22F 12/226 |
| | | | 400/283 |
| 2014/0036455 | A1 | 2/2014 | Napadensky |
| 2014/0141168 | A1* | 5/2014 | Rodgers ................. B33Y 70/00 |
| | | | 427/265 |
| 2015/0174828 | A1 | 6/2015 | Creuzer et al. |
| 2016/0107379 | A1 | 4/2016 | Mark et al. |
| 2016/0236414 | A1* | 8/2016 | Reese ..................... B33Y 50/02 |
| 2016/0299996 | A1 | 10/2016 | Huang |
| 2016/0320771 | A1 | 11/2016 | Huang |
| 2016/0339644 | A1 | 11/2016 | Sobue et al. |
| 2017/0001377 | A1* | 1/2017 | Meisner ............... B29C 64/209 |
| 2017/0239892 | A1 | 8/2017 | Buller et al. |
| 2017/0368753 | A1 | 12/2017 | Yang et al. |
| 2018/0099333 | A1* | 4/2018 | DehghanNiri .......... B22F 10/37 |
| 2018/0154437 | A1 | 6/2018 | Mark |
| 2018/0154439 | A1 | 6/2018 | Mark |
| 2018/0154580 | A1 | 6/2018 | Mark |
| 2019/0009472 | A1* | 1/2019 | Mark .................... B29C 64/393 |
| 2019/0054700 | A1* | 2/2019 | Chandar ................. G06F 17/18 |
| 2019/0240775 | A1 | 8/2019 | Graham et al. |
| 2020/0143006 | A1 | 5/2020 | Matusik et al. |
| 2020/0156322 | A1 | 5/2020 | Yorozu |
| 2020/0262149 | A1* | 8/2020 | Zydzik ................. B29C 64/393 |
| 2020/0324465 | A1 | 10/2020 | Deruyck et al. |
| 2020/0331061 | A1* | 10/2020 | Redding ............... B33Y 30/00 |
| 2021/0197462 | A1* | 7/2021 | Brochier .............. B29C 64/232 |

FOREIGN PATENT DOCUMENTS

| | | |
|---|---|---|
| EP | 3656536 A1 | 5/2020 |
| WO | 2019/089323 A1 | 5/2019 |

OTHER PUBLICATIONS

Search Report dated Nov. 28, 2023, in European Patent Application No. 23171377.7.

\* cited by examiner

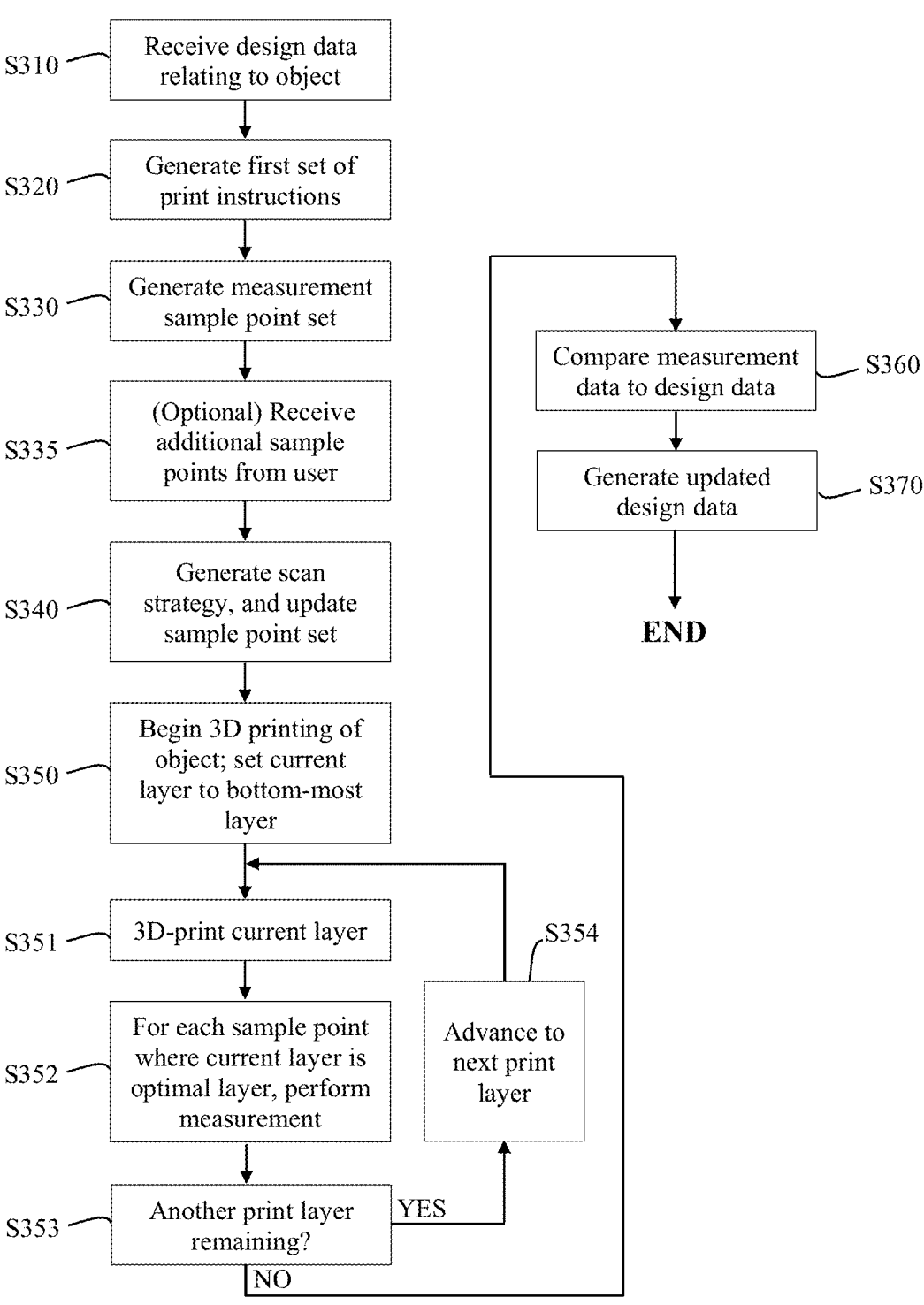

S310 — Receive design data relating to object

S320 — Generate first set of print instructions

S330 — Generate measurement sample point set

S335 — (Optional) Receive additional sample points from user

S340 — Generate scan strategy, and update sample point set

S350 — Begin 3D printing of object; set current layer to bottom-most layer

S351 — 3D-print current layer

S352 — For each sample point where current layer is optimal layer, perform measurement S353 — Another print layer remaining?

YES

S354 — Advance to next print layer

NO

S360 — Compare measurement data to design data

S370 — Generate updated design data

END

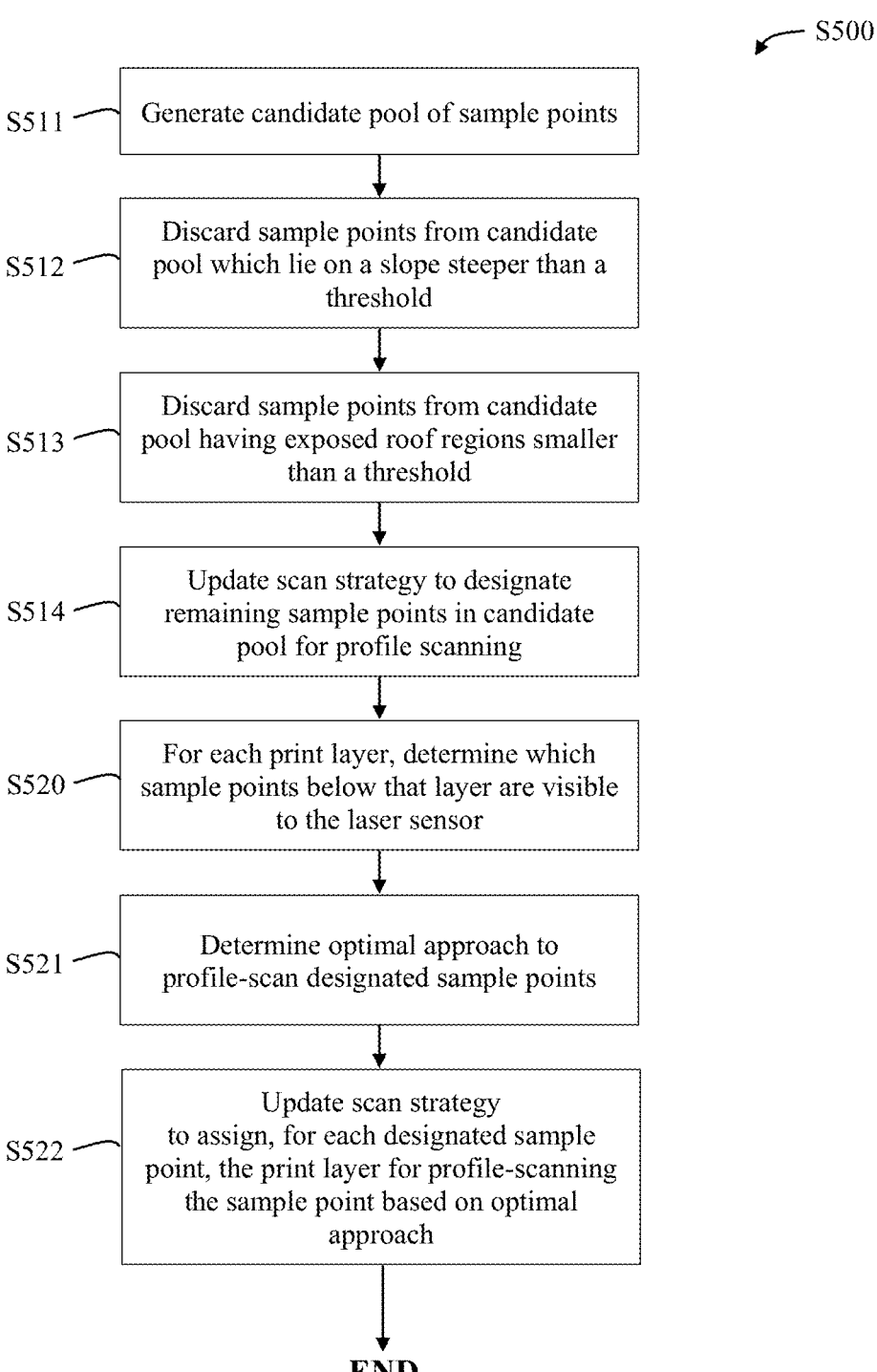

S511 — Generate candidate pool of sample points

S512 — Discard sample points from candidate pool which lie on a slope steeper than a threshold S513 — Discard sample points from candidate pool having exposed roof regions smaller than a threshold S514 — Update scan strategy to designate remaining sample points in candidate pool for profile scanning S520 — For each print layer, determine which sample points below that layer are visible to the laser sensor S521 — Determine optimal approach to profile-scan designated sample points S522 — Update scan strategy to assign, for each designated sample point, the print layer for profile-scanning the sample point based on optimal approach

END

FIG. 6A

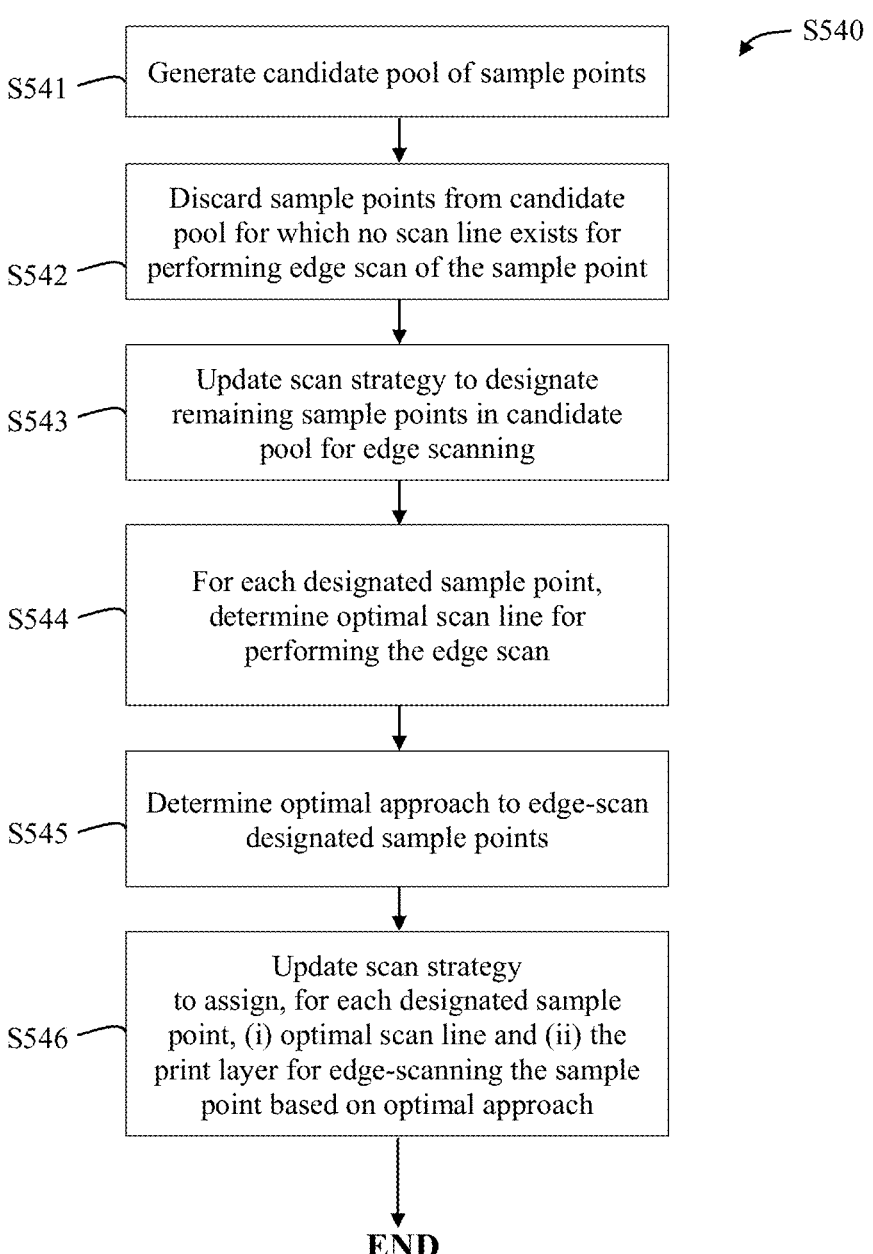

S540

S541 — Generate candidate pool of sample points

S542 — Discard sample points from candidate pool for which no scan line exists for performing edge scan of the sample point S543 — Update scan strategy to designate remaining sample points in candidate pool for edge scanning S544 — For each designated sample point, determine optimal scan line for performing the edge scan S545 — Determine optimal approach to edge-scan designated sample points S546 — Update scan strategy to assign, for each designated sample point, (i) optimal scan line and (ii) the print layer for edge-scanning the sample point based on optimal approach

END

*FIG. 6B*

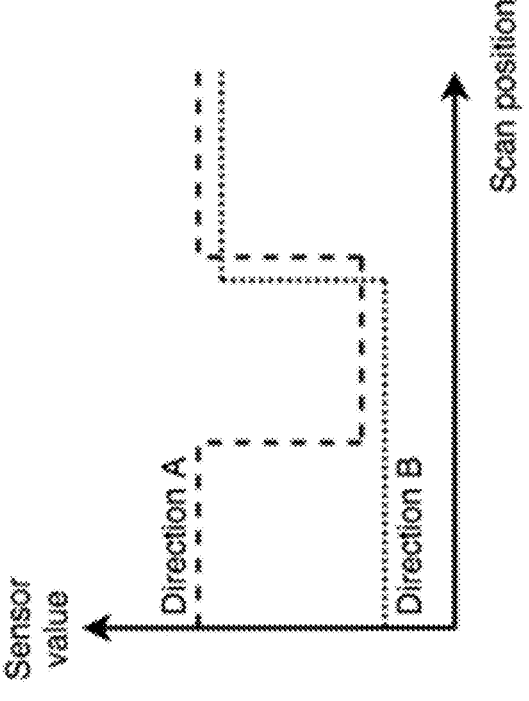
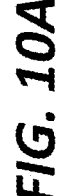
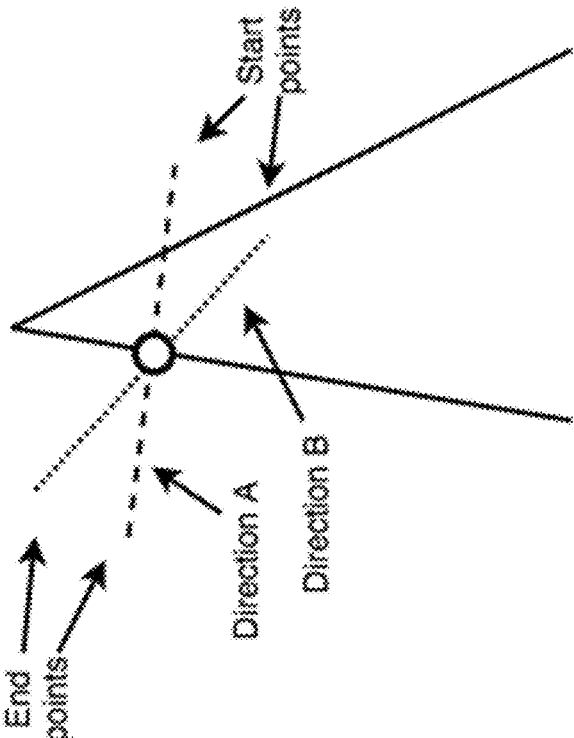
*FIG. 10A*

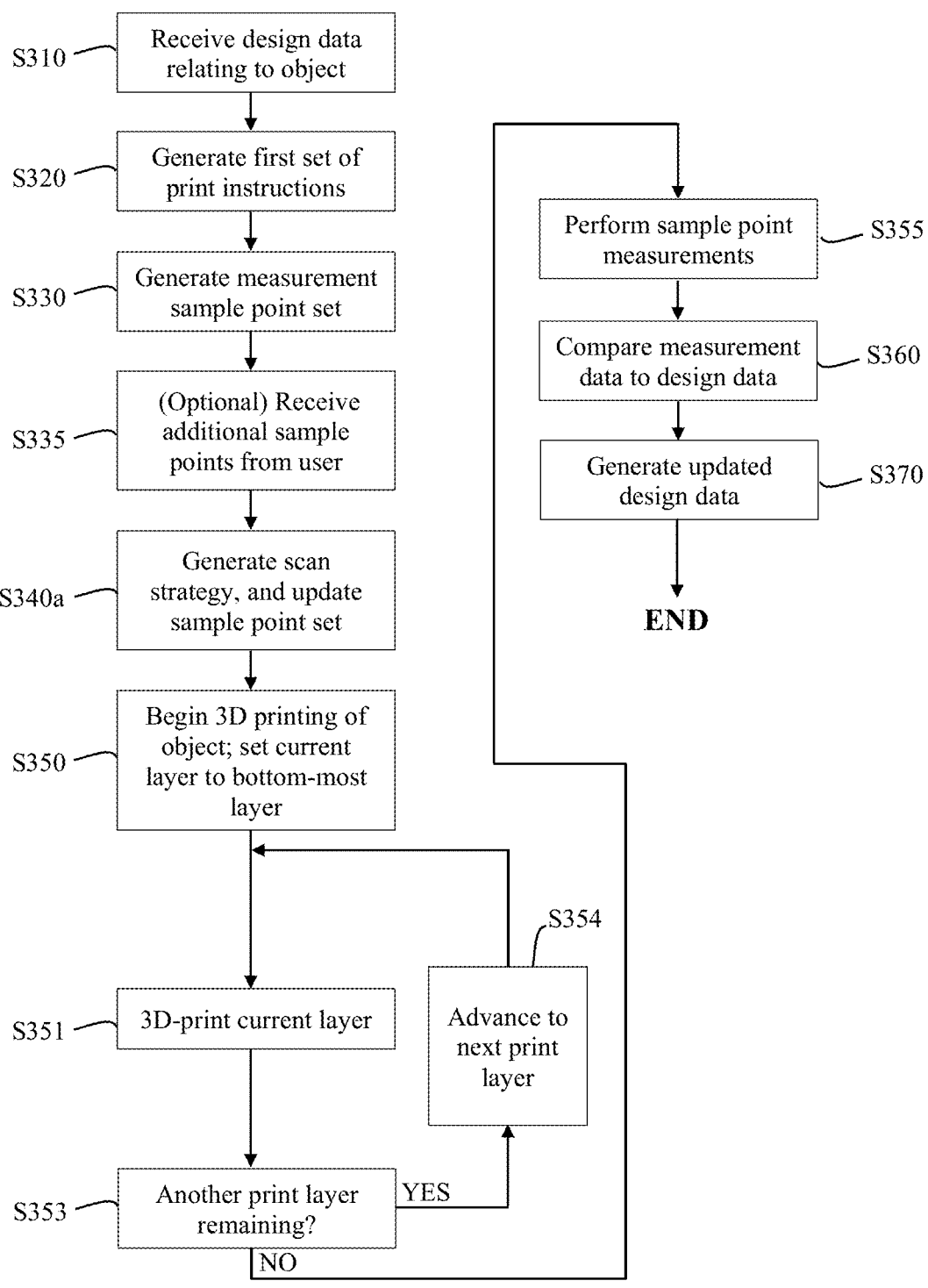

S310 — Receive design data relating to object

S320 — Generate first set of print instructions

S330 — Generate measurement sample point set

S335 — (Optional) Receive additional sample points from user

S340a — Generate scan strategy, and update sample point set

S350 — Begin 3D printing of object; set current layer to bottom-most layer

S351 — 3D-print current layer

S353 — Another print layer remaining?

YES

S354 — Advance to next print layer

NO

S355 — Perform sample point measurements

S360 — Compare measurement data to design data

S370 — Generate updated design data

END

FIG. 12

S1700 — Distinguish left slope and right slope of groove

S1710 — Compute regressions of left and right slopes based on depth measurements S1720 — Determine groove center

END

S1900 — Receive set of X-Y coordinates

S1910 — Apply and store transformation to X-Y coordinates

END

S2100 — Receive scan line

S2110 — Lengthen scan line to accommodate truncation

S2120 — Perform forward-direction measurement scan

S2130 — Perform reverse-direction measurement scan

S2140 — Correlate forward and reverse scan signals

S2150 — Determine and apply compensation amounts to forward and reverse scan signals S2160 — Generate final scan signal

END

S2200 — Install reference bed

S2210 — Perform bidirectional measurement scans

S2220 — Store phase shift amounts and/or compensation amounts

END

S2400 —  Receive movement instructions

S2410 —  Generate compensated movement instructions

END

3D PRINTING AND MEASUREMENT APPARATUS AND METHOD

CROSS-REFERENCE TO RELATED APPLICATIONS

This application is a divisional of U.S. application Ser. No. 18/876,496, filed May 18, 2020 which claims the benefit under 35 U.S.C. § 119(e) of U.S. Provisional Patent Application No. 62/849,432, filed May 17, 2019, and titled "Method and System For Improved Geometric Robustness of 3D-Printed Parts," the entirely of which is incorporated by reference.

FIELD OF THE INVENTION

The invention relates to an apparatus and method for accurately 3D-printing and measuring a product.

BACKGROUND OF THE INVENTION

Industries have increasingly turned to 3D printing for manufacturing products such as system components. These 3D printers generally take design specification data as input, and employ an additive manufacturing technique to construct a finished product.

Due to limitations of 3D printing, conventional 3D printers have certain amounts of errors (e.g., imperfections) between the design specification and the finished product.

Some conventional 3D printers address this limitation by employing an active feedback process during the printing operation. The feedback process identifies printing errors on already-printed portions of a partially-printed product, and adjusts the ongoing printing operation moving forward to minimize errors in the remaining portions of the product being printed. This process is also known as in-process correction, and is employed to reduce imperfections on a partially-printed product. In general, using in-process correction may provide a printed product with sufficiently reduced imperfections to be deemed acceptable to some recipients, without requiring a re-printing of the product.

However, the inventors of the present application recognized that for various industrial applications, it is critical that a component in a system be manufactured precisely to design specifications. Not only must the dimensions of the component be accurate, the internal structure and composition must likewise be consistent with the specification. Deviations from specification could result in poor fitment or durability, risking temporary system downtime from damage to that one system component, or even permanent damage to other system components, physical injury, or death.

The inventors of the present application recognized that for these applications, the level of imperfection reduction provided by in-process correction is not acceptable. By the time that an in-process correction operation identifies the need to perform the correction, the already-printed portion of that product already contains a defect. As a result of that existing defect, the entire product is deemed defective to the recipient. Moreover, in-process correction does not provide information as to the extent and location of imperfections within the finished product. Nor does the process provide information that could be useful towards a re-print operation of the product that resolves such imperfections.

In other words, the inventors of the present application recognized that these conventional apparatuses seek to manufacture a product with reduced imperfections, rather than identifying the imperfections in an already-printed product and using such identifications to re-print a product that complies with design specifications and is imperfection-free.

Therefore, the inventors of the present application recognized that a need exists in the art to accurately identify both external and internal imperfections in a printed product and utilize the imperfection data to construct a printing strategy that re-prints the product without the imperfections. The inventors of the present application also recognized that a need also exists in the art to incorporate a measurement device, such as a laser scanner, with a 3D printer so that such imperfections may be identified and accurate correction information can be determined for constructing a re-print strategy. The inventors of the present application recognized further that a need further exists in the art to determine inaccuracies in the positioning of a printing system and provide correction for such inaccuracies.

SUMMARY OF THE INVENTION

In one aspect, the invention relates to an apparatus comprising a processor, and a memory, wherein the memory stores computer-readable instructions which, when executed by the processor, cause the processor to: (i) receive design information corresponding to an object for which a printed object is to be generated by a 3D printing operation according to a first set of print instructions, (ii) generate, using the design information, a set of measurement locations, the measurement locations representing locations on one or more surfaces of the object to be measured by a measurement device, (iii) generate a measurement strategy for performing measurement of the set of measurement locations by the measurement device, (iv) receive measurement data corresponding to the measurement locations measured according to the measurement strategy, after the 3D printing operation according to the first set of print instructions has been initiated on a print device, (v) compare the measurement data to the design information, (vi) identify, based on the comparing, deviations between the printed object and the object represented by the design information, and (vii) generate information corresponding to the object which reflects the identified deviations.

In another aspect, the invention relates to a method of 3D printing an object, comprising receiving design information corresponding to an object for which a printed object is to be generated by a 3D printing operation according to a first set of print instructions, generating a plurality of measurement locations, the measurement locations representing locations of the object to be measured by a measurement device, printing successive layers which form the object, measuring the object at the measurement locations to form measurement data, comparing the measurement data with expected measurements of the measurement locations based on the design information, and generating, based on the comparing, deviation information representing deviations between printed object following completion of the printing, and the object represented by the design information.

In a further aspect, the invention relates to a method of manufacturing an object defined by design information, comprising controlling a manufacturing apparatus to manufacture the object according to a first set of manufacturing instructions, controlling a measurement apparatus to measure the manufactured object, determining deviations between the object as measured and the object as defined by design information, and generating a second set of manufacturing instructions according to the determined deviations.

In still a further aspect, the invention relates to a method of correcting positioning errors in a system that includes a movement component, comprising detecting a plurality of topographical features positioned at different locations on the surface of an object disposed within the movement system, comparing a location of the detected topographical features to expected locations for the topographical features, generating transformation information based on the comparison, and correcting movement instructions of the movement component based on the generated transformation information.

In yet still a further aspect, the invention relates to a method of correcting positioning error in a 3D-printing system that includes a movement component and a detection component, comprising detecting, using the detection component, a plurality of topographical features positioned at different locations on a reference object disposed on the 3D-printing system, comparing a location of the detected topographical features to expected locations for the topographical features, generating transformation information based on the comparison; and correcting 3D-printing instructions for controlling the movement component, based on the generated transformation information.

In again still a further aspect, the invention relates to a method of measuring an object with a measurement apparatus that includes a measurement component coupled to a movement component, comprising moving, with the movement component, the measurement component along a measurement path in a forward direction, detecting, with the measurement component, a forward measurement of the object along the measurement path during the moving in the forward direction, moving, with the movement component, the measurement component along the measurement path in a reverse direction opposite to the forward direction, detecting, with the measurement component, a reverse measurement of the object along the measurement path during the moving in the reverse direction, comparing the forward measurement and the reverse measurement, and generating a corrected measurement based on the comparing and at least one of the forward measurement and the reverse measurement.

These and other aspects of the invention will become apparent from the following disclosure.

BRIEF DESCRIPTION OF THE DRAWINGS

FIG. 3 is a flow chart for performing 3D-printing and measuring an object, in accordance with one embodiment.

FIGS. 6A and 6B are flow charts for performing 3D-printing and measuring an object, in accordance with one embodiment.

FIGS. 10A and 10B illustrate overhead views of an edge and potential edge scan directions.

FIG. 12 is a flow chart for performing 3D-printing and measuring an object, in accordance with yet another embodiment.

DETAILED DESCRIPTION OF THE PREFERRED EMBODIMENTS

One aspect of the invention is an apparatus and method for performing 3D-printing and scanning of an object.

Figure 1A:
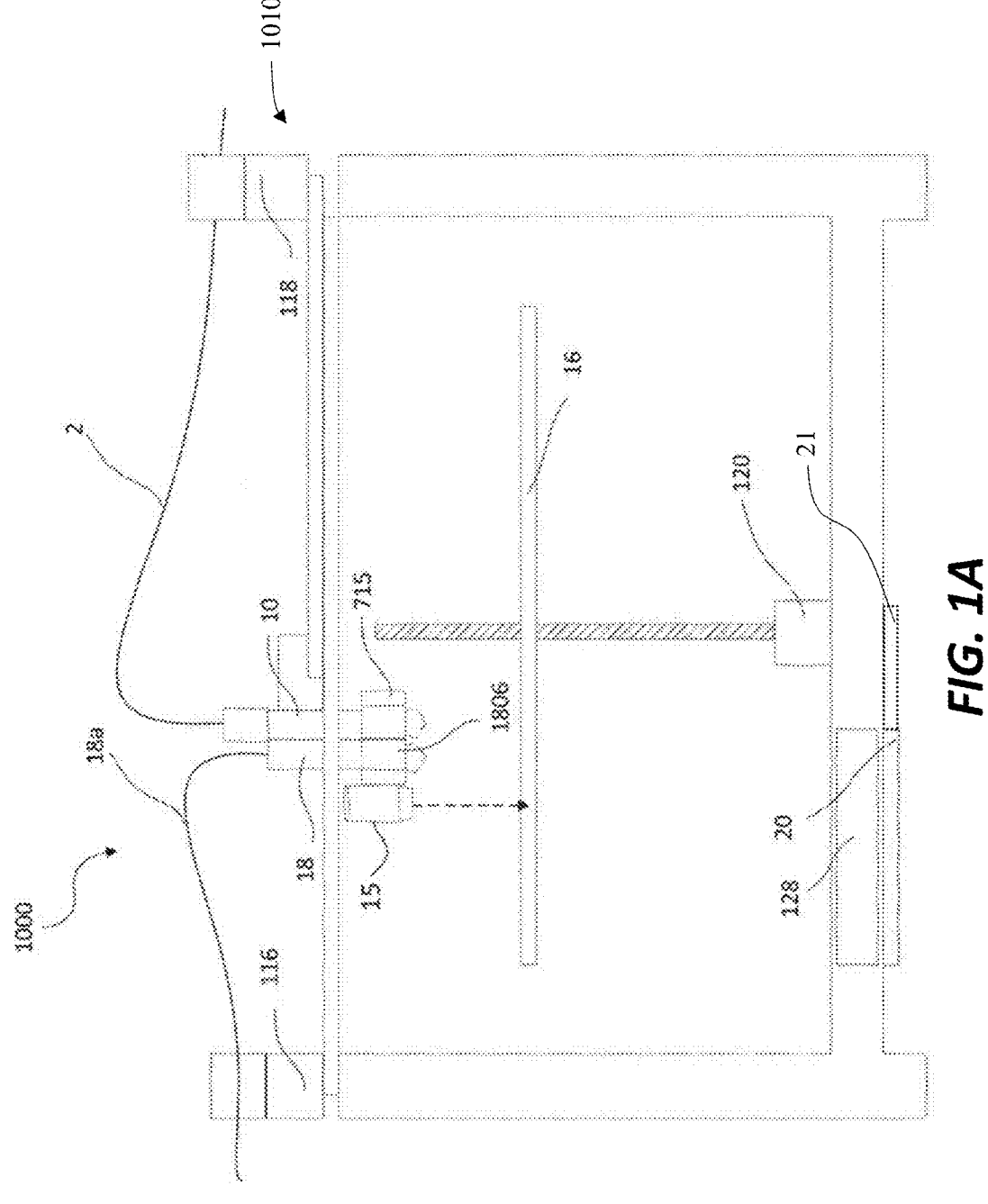
FIGS. 1A and 1B illustrate an apparatus, in accordance with one embodiment.
Figure 1B:
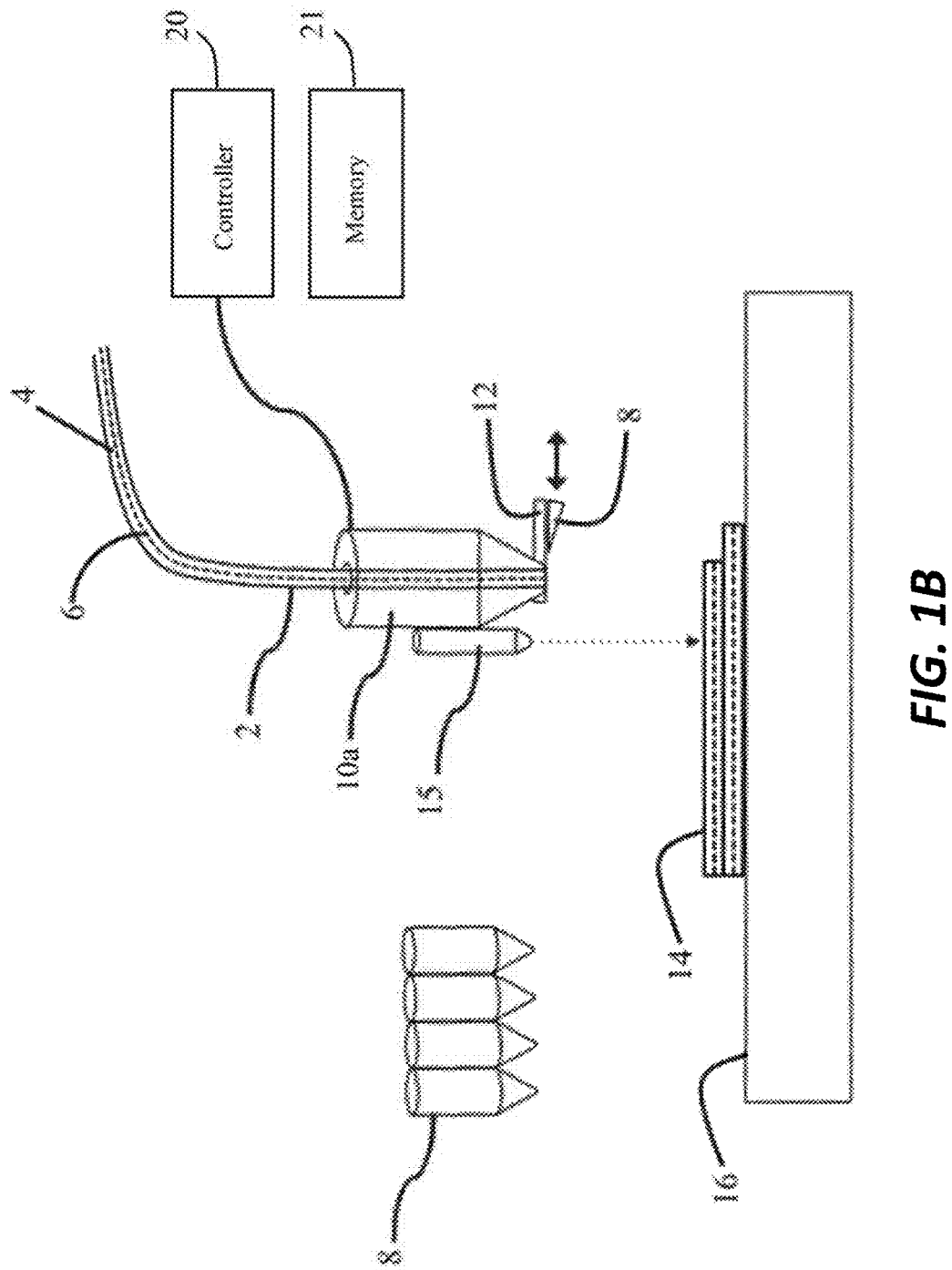

FIGS. 1A-1B illustrate an apparatus 1000 in accordance with one embodiment of the invention. The apparatus 1000 includes a controller 20 and one or more print heads 10, 18. For instance, one head 10 may deposit a metal or fiber reinforced composite filament 2, and another head 18 may apply pure or neat matrix resin 18a (thermoplastic or curing). In the case of the filament 2 being a fiber reinforced composite filament, such filament (also referred to herein as continuous core reinforced filament) may be substantially void free and include a polymer or resin that coats, permeates or impregnates an internal continuous single core or multistrand core. It should be noted that although the print head 18 is shown as an extrusion print head, "fill material print head" 18 as used herein includes optical or UV curing, heat fusion or sintering, or "polyjet", liquid, colloid, suspension or powder jetting devices (not shown) for depositing fill material. It will also be appreciated that a material bead formed by the filament 10a may be deposited as extruded thermoplastic or metal, deposited as continuous or semi-continuous fiber, solidified as photo or UV cured resin, or jetted as metal or binders mixed with plastics or metal, or are structural, functional or coatings. The fiber reinforced composite filament 2 (also referred to herein as continuous core reinforced filament) may be a push-pulpreg that is substantially void free and includes a polymer or resin 4 that coats or impregnates an internal continuous single core or multistrand core 6. The apparatus includes heaters 715, 1806 to heat the print heads 10, 18, respectively so as to facilitate deposition of layers of material to form the object 14 to be printed. A cutter 8 controlled by the controller 20 may cut the filament 2 during the deposition process in order to (i) form separate features and components on the structure as well as (ii) control the directionality or anisotropy of the deposited material and/or bonded ranks in multiple sections and layers. As depicted, the cutter 8 is a cutting blade associated with a backing plate 12 located at the nozzlet outlet. Other cutters include laser, high-pressure air or fluid, or shears. The apparatus 1000 may also include additional non-printing tool heads, such as for milling, SLS, etc.

The apparatus 1000 includes a gantry 1010 that supports the print heads 10, 18. The gantry 1010 includes motors 116, 118 to move the print heads 10, 18 along X and Y rails in the X and Y directions, respectively. The apparatus 1000 also includes a build platen 16 (e.g., print bed) on which an object to be printed is formed. The height of the build platen 16 is controlled by a motor 120 for Z direction adjustment. Although the movement of the apparatus has been described based on a Cartesian arrangement for relatively moving the print heads in three orthogonal translation directions, other arrangements are considered within the scope of, and expressly described by, a drive system or drive or motorized drive that may relatively move a print head and a build plate supporting a 3D printed object in at least three degrees of freedom (i.e., in four or more degrees of freedom as well). For example, for three degrees of freedom, a delta, parallel robot structure may use three parallelogram arms connected to universal joints at the base, optionally to maintain an orientation of the print head (e.g., three motorized degrees of freedom among the print head and build plate) or to change the orientation of the print head (e.g., four or higher degrees of freedom among the print head and build plate). As another example, the print head may be mounted on a robotic arm having three, four, five, six, or higher degrees of freedom; and/or the build platform may rotate, translate in three dimensions, or be spun.

FIG. 1B depicts an embodiment of the apparatus 1000 applying the filament 2 to build a structure. In one embodiment, the filament 2 is a metal filament for printing a metal object. In one embodiment, the filament 2 is a fiber reinforced composite filament (also referred to herein as continuous core reinforced filament) may be a push-pulpreg that is substantially void free and includes a polymer or resin 4 that coats or impregnates an internal continuous single core or multistrand core 6.

The filament 2 is fed through a nozzlet 10a disposed at the end of the print head 10, and heated to extrude the filament material for printing. In the case that the filament 2 is a fiber reinforced composite filament, the filament 2 is heated to a controlled push-pultrusion temperature selected for the matrix material to maintain a predetermined viscosity, and/or a predetermined amount force of adhesion of bonded ranks, and/or a surface finish. The push-pultrusion may be greater than the melting temperature of the polymer 4, less than a decomposition temperature of the polymer 4 and less than either the melting or decomposition temperature of the core 6.

After being heated in the nozzlet 10a and having its material substantially melted, the filament 2 is applied onto the build platen 16 to build successive layers 14 to form a three dimensional structure. One or both of (i) the position and orientation of the build platen 16 or (ii) the position and orientation of the nozzlet 10 are controlled by a controller 20 to deposit the filament 2 in the desired location and direction. Position and orientation control mechanisms include gantry systems, robotic arms, and/or H frames, any of these equipped with position and/or displacement sensors to the controller 20 to monitor the relative position or velocity of nozzlet 10a relative to the build platen 16 and/or the layers 14 of the object being constructed. The controller 20 may use sensed X, Y, and/or Z positions and/or displacement or velocity vectors to control subsequent movements of the nozzlet 10a or platen 16. The apparatus 1000 may include a laser scanner 15 to measure distance to the platen 16 or the layer 14, displacement transducers in any of three translation and/or three rotation axes, distance integrators, and/or accelerometers detecting a position or movement of the nozzlet 10a to the build platen 16. The laser scanner 15 may scan the section ahead of the nozzlet 10a in order to correct the Z height of the nozzlet 10a, or the fill volume required, to match a desired deposition profile. This measurement may also be used to fill in voids detected in the object. The laser scanner 15 may also measure the object after the filament is applied to confirm the depth and position of the deposited bonded ranks. Distance from a lip of the deposition head to the previous layer or build platen, or the height of a bonded rank may be confirmed using an appropriate sensor.

Various 3D-printing aspects of the apparatus 1000 are described in detail in U.S. Patent Application Publication No. 2019/0009472, which is incorporated by reference herein in its entirety.

Laser Scanner

Various aspects of the laser scanner 15 will now be discussed. The laser scanner 15 may scan the section ahead of the next deposition in order to correct the Z height of the nozzlet 10a, or the fill volume required, to match a desired deposition profile. This measurement may also be used to fill in voids detected in the part. The laser scanner 15 may measure the object after the filament is applied to confirm the depth and position of the deposited bonded ranks. Distance from a lip of the deposition head to the previous layer or build platen, or the height of a bonded rank may be confirmed using an appropriate sensor, including the laser scanner 15.

Figure 2:
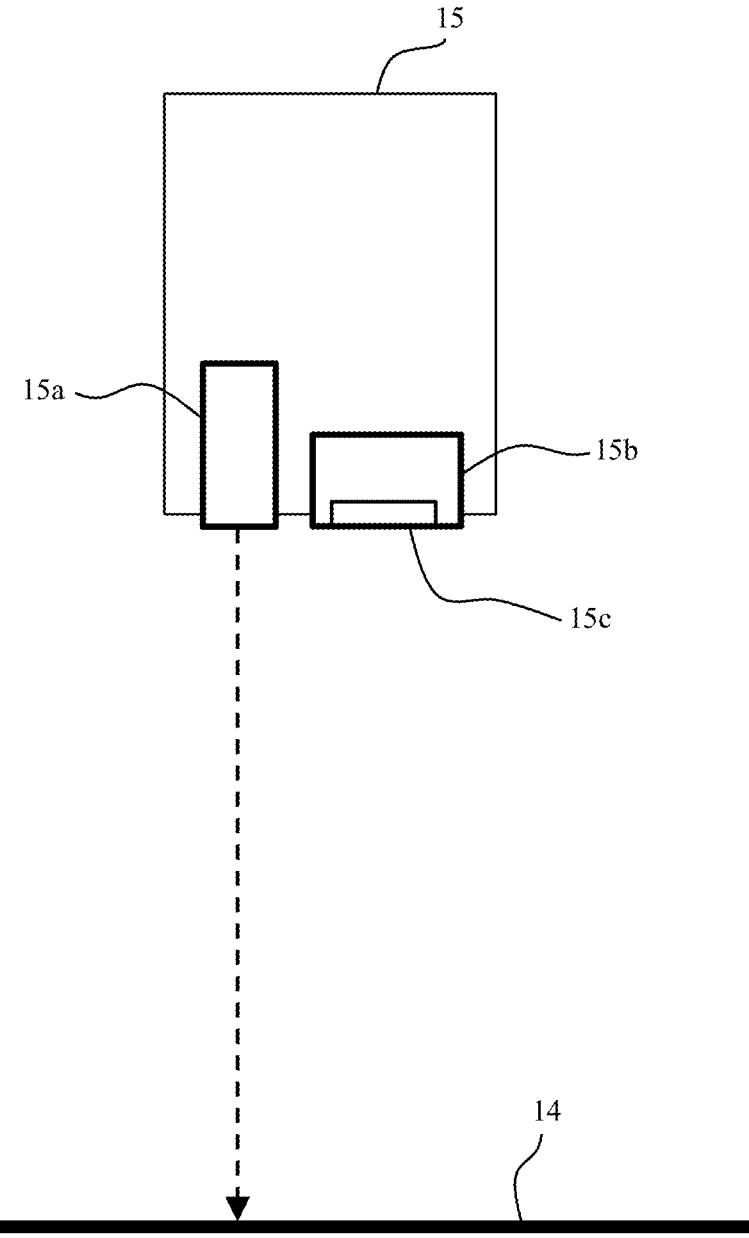
FIG. 2 is a block diagram illustrating components of the apparatus, in accordance with one embodiment.

The laser scanner 15 may be formed as a short-range laser scanner, a high resolution RGBD camera, a triangulating, time of flight, phase difference, or interferometric scanner, a structured light camera or sensor, or the like. As illustrated in FIG. 2, the laser scanner 15 includes a laser emitter 15a and a laser receiver 15b.

In one embodiment, the laser scanner 15 is mounted on (e.g., integral with) the print head 10. In another embodiment, the laser scanner 15 is mounted on an independent head coupled to the print head 10. In yet another embodiment, the laser scanner 15 is fixed to the apparatus 1000 (e.g., mounted to a chassis), and the object to be measured is moved relative to the laser scanner 15.

The laser emitter 15a emits a laser beam of a predetermined sized profile on the surface of the object to be scanned. In one embodiment, the laser emitter 15a is arranged such that the emitted laser beam is oriented generally downward at a predetermined angle relative to a vertical direction of the apparatus. In one embodiment, the predetermined angle is oblique. In one embodiment, the predetermined angle is in a range between 0 and 89 degrees relative to the vertical direction, preferably between 0 and 45 degrees, and even more preferably between 0 and 20 degrees.

In one embodiment, the predetermined angle of the emitted laser beam is zero, such that the laser beam is coincident with the vertical direction and oriented directly downward. In one embodiment, the laser beam is a circular (e.g., dot) profile. In one embodiment, the diameter of the laser dot is between 0.1 and 100 μm, preferably between 20 and 80 μm, and even more preferably between 40 and 60 μm. In one embodiment, the laser beam has a profile other than a circular profile, such as a line profile or a chevron profile.

The laser receiver 15b senses the laser beam emitted from the laser emitter 15a, incident and visible on a surface of the 3D-printed object. In one embodiment, the laser receiver includes an optical sensor 15c and an optical system (not shown). In one embodiment, the optical sensor 15c is a two-dimensional sensor, including but not limited to a CCD or CMOS sensor. In another embodiment, the optical sensor 15c is a line sensor. In one embodiment, the laser scanner 15 includes a vision system to analyze optical signals received from the optical sensor 15c.

The optical sensor 15c is arranged so as to face generally downward, at a predetermined angle relative to the vertical direction of the apparatus. In one embodiment, the predetermined angle is oblique. In one embodiment, the predetermined angle is in a range between 0 and 89 degrees relative to the vertical direction, preferably between 0 and 45 degrees, and even more preferably between 0 and 20 degrees. In one embodiment, the predetermined angle is zero, such that the optical detector is facing directly downward in the vertical direction.

In one embodiment, the laser beam emitted from the laser emitter 15a is aimed directly downwards, and the optical sensor 15c is likewise aimed directly downwards. In one embodiment, the laser beam emitted from the laser emitter 15a is aimed directly downwards, while the optical sensor 15c is oriented at an angle relative to the vertical direction, preferably in a range between 0 and 45 degrees relative to the vertical direction, even more preferably between 0 and 20 degrees, and even further more preferably between 0 and 5 degrees. In one embodiment, the laser emitter 15a and the laser receiver 15b are arranged to be as close to each other as possible.

The apparatus may rely on principles of triangulation to determine the distance (e.g., depth) between the laser scanner 15 and the surface of the object on which the laser beam is incident. In particular, the distance will affect the position of the laser beam as observed from the laser receiver's perspective. The distance may be determined based on where the laser beam is observed within the laser receiver's perspective.

It will be appreciated that laser scanning involves a line of sight between the laser emitter 15a and the sample point being scanned (so that the laser beam is incident on the sample point) and a line of sight between the optical sensor 15c and the sample point (so that the visualized laser beam incidence on the object is visible to the optical sensor).

Laser Scan Modes

In one embodiment, the laser scanner 15 is operable in multiple modes of scanning. In one embodiment, the laser scanner 15 is operable at least in (i) a profile scan mode that performs a profile scan of a sample point, and (ii) an edge scan mode that performs an edge scan of a sample point. These modes of scanning are described as follows.

(i) Profile-Scanning

Profile-scanning of a sample point involves moving the print head 10 (and therefore the laser scanner) to the X-Y position of a sample point and taking a depth measurement to determine the Z position of the sample point on the surface of the scan object. The depth measurement may be performed while the print head is stationary or while the print head is continuously moving. In many instances, profile-scanning of a sample point involves taking one depth measurement for that sample point when scanning is performed in one direction along a scan path (unidirectional scanning), or taking two depth measurements when scanning first in one direction and then in the reverse direction along the scan path (bidirectional scanning). As a result, a profile scan provides a relatively rapid measurement of a sample point.

A profile scan provides a successful measurement when the sample point is located on a surface that is relatively flat. However, depending on characteristics of the sample point, a profile scan may not produce a successful measurement, as described further below.

(ii) Edge-Scanning

For sample points where profile-scanning may not produce a successful measurement, edge scanning may be used to measure the sample point. In particular, edge-scanning may produce a successful measurement when the sample point is located on (or near) an edge or on a surface with a steep slope, where a profile scan may not succeed.

Edge-scanning involves taking a series of measurements across the edge of a part in order to determine the location of the edge and the depth of the sample point on (or near) that edge. Generally, an edge scan requires taking multiple measurement readings per edge. The number of measurements depends on various factors, such as desired tolerances and the nature of the edge. In one embodiment, edge-scanning involves approximately 20-50 depth measurements per edge.

Once the depth measurements are obtained, the location and nature of the edge are determined. This may be accomplished using convolution methodologies of the edge scan signals to discriminate the edge. After the edge has been identified, an accurate depth measurement may be determined in light of the nature of the edge.

Advantages of Profile-Scanning

For sample points where profile scanning is expected to be successful, profile scanning is generally preferred over edge scanning. This is because profile scanning is an order of magnitude faster than edge scanning, by requiring fewer depth measurements per sample point, a smaller scan path length, and less intensive computational processing.

Advantages of Edge-Scanning

While profile-scanning of a sample point is preferred when possible, it is recognized that profile scanning may only be suitable for certain sample points such as the top surface of a part. That is, profile scanning may encounter difficulties accurately determining the depth profile at steeper points or at transitions (e.g., edges). As such, edge scanning is a preferable strategy for sample points which lie on steep walls and underside surfaces, so that accurate depth measurements for these sample points may be obtained.

Figure 7:
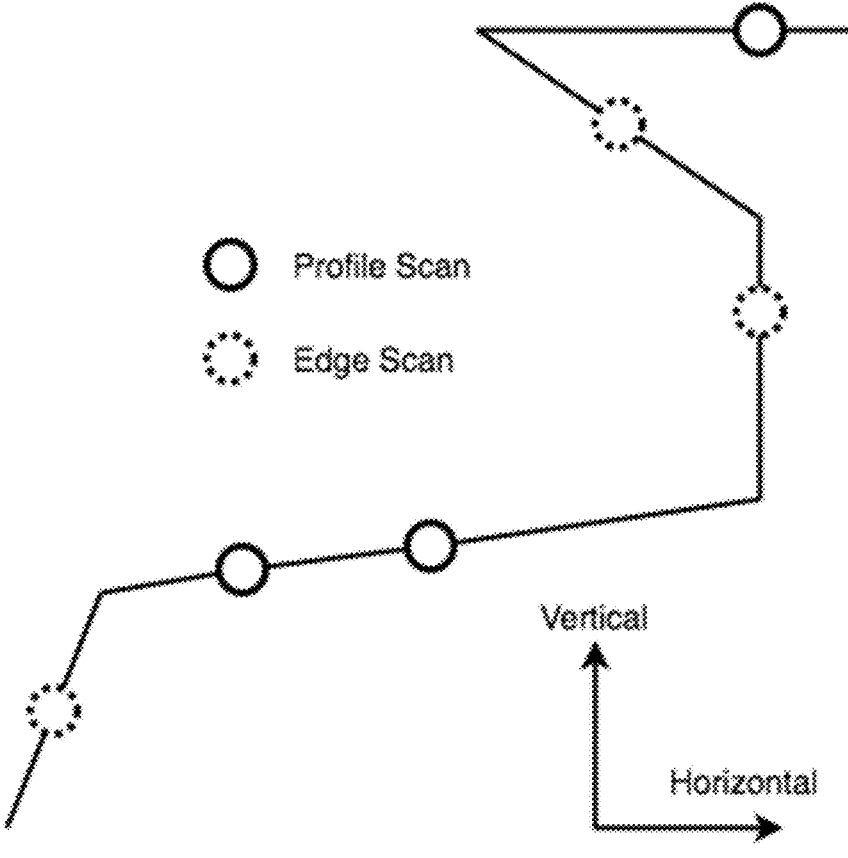
FIG. 7 illustrates a topographical example depicting sample points for profile-scanning and edge-scanning measurements.

FIG. 7 illustrates an example surface topology and a preferred scanning mode for various sample points. As shown, certain sample points (as identified in FIG. 7) lie on a relatively flat surface, and therefore may be profile-scanned to yield an accurate measurement. However, other sample points (as identified in FIG. 7) lie on a steep slope or along an edge, such that profile-scanning may not provide an accurate measurement. As a result, it may be preferable that these latter sample points are edge-scanned.

Other Embodiments

In one embodiment, the laser scanner 15 includes multiple laser emitters 15a and/or multiple laser receivers 15b. In one embodiment, the laser scanner 15 includes multiple laser emitters 15a per each laser receiver 15b, and/or multiple laser receivers 15b per each laser emitter 15a.

In one embodiment, the laser scanner 15 is positioned at locations other than above the object to be printed. In one embodiment, the laser scanner 15 is positioned to the side of the object to be printed. In one embodiment, the laser scanner 15 is positioned below the object to be printed.

In one embodiment, the apparatus 1000 includes multiple laser scanners 15. In one embodiment, the apparatus 1000 includes multiple laser scanners 15 positioned at different perspectives (e.g., top, side, bottom) relative to the object.

In one embodiment, a touch probe is employed instead of (or in addition to) the laser scanner 15 to perform depth/distance measurements.

In one embodiment, the print nozzle is used instead of (or in addition to) the laser scanner 15 to perform a contact-sensing operation to perform depth/distance measurements. In particular, the apparatus 1000 is equipped with detection capabilities for detecting when the nozzle 10 (and/or nozzle 18) contacts the build platen 16, a print layer, and/or a print material bead. By moving the nozzle 10 along the X, Y, and/or Z directions and detecting when contact occurs between the nozzle 10 and the print layer, the apparatus 1000 may take measurements of sample points on the print layer. For example, the nozzle 10 may be moved to the X-Y position of the sample point and lowered until contact is detected, and the Z-position at the time of contact is used to determine the measurement.

In one embodiment, the laser scanner 15 is used to calibrate the Z-positioning within the apparatus 1000. A 3D printing system structured to print form a deposition head capable of higher Z resolution (e.g., beyond 200 micron layer height, to 100, 50, 25, or higher micron layer height) encounters the problem of interference with, or excessive clearance from, the build platen 16 in early layers. If the deposition technique is performed, e.g., less than 50 microns from the build platen 16, one would expect the tolerance among the build platen surface and gantry supports (e.g., X, Y rails) to be sufficiently similar to the 50 micron initial height such that no interference with the build platen 16, or excessive clearance from the build platen 16, is encountered.

However, the 3D printing system includes tolerance stack-up and temperature and environmental response. As different components of the 3D printing system heat and cool (for example, the gantry beams, supports, and rails, or the build platen itself, or drive components), the distance between the deposition head's printing height and the build platen may vary, as may the nominal bead size etc. Accordingly, while factory-side calibration may be made versus systematic error among the component parts, a calibration scan by the laser scanner 15 of the build platen 16, and potentially including a printed calibration target upon build platen 16, upon each print job is significantly more likely to account for additional environmentally determined systematic error.

With respect to the calibration target as a bead deposition, each printing material deposition head depicted in FIGS. 1A-1C, 28, 2A-2H traces toolpaths, e.g., G-code and the like, to deposit printing material, which may be in a line of minimum width and height (whether a bead is deposited as extruded thermoplastic or metal, deposited as continuous or semi-continuous fiber, solidified as photo or UV cured resin, or jetted as metal or binders mixed with plastics or metal, or are structural, functional or coatings). The laser scanner 15 may be positioned to measure surface profiles of the build platen 16 and/or an initial bead. The surface profile may be a height map of the build platen, or of calibration beads or structures.

Optionally, the measured surface profiles of one, some, or many previously scanned build platens 16 and/or initial beads may be used as calibration. A receiving circuit may receive the selection of build platens 16 and/or initial beads to be scanned from a remote process, from an external device, such as a local or remote computer performing slicing and providing the G-code, the identification, and the selection.

For the purpose of calibrating the printing deposition head and/or the laser scanner 15 for a current environmental state, e.g., a "ready to print" heated state of the system reflecting the effect of current ambient and machine temperature distribution on dimensions in the system, the controller 20 alternatively or further detects or receives an indication the build platen 16 is to be scanned for calibrating the system, and/or receives a calibration target toolpath (e.g., from a local or remote processor), and executes instructions to cause the printing material deposition head that traces toolpaths to deposit a printing material bead or shell to form a first layer 3D printed calibration target (not shown, e.g., a straight line, a perimeter, a ring, a square, a bar, a tower, or the like).

As noted, the controller 20 (which may include an inspection processor for performing the inspection) may detect or receives an indication the build platen 16 is to be scanned for calibrating the system, and/or generate a calibration target toolpath for depositing the first layer 3D printed calibration target. Optionally, the target is printed in a portion of the build platen 16 that does not interfere with a part to be printed using the calibration. The inspection processor may transmit the calibration target toolpath defining the first layer 3D printed calibration target for deposition by a 3D printer. After the 3D printer prints the calibration target, the inspection processor may compute a process calibration including a comparison between the received scanned surface profile of the build platen 16 and/or the first layer 3D printed calibration target and the calibration target toolpath. Similarly, the inspection processor may additionally, or in the alternative, receive a tolerance definition for the build platen 16 and/or the first layer 3D printed calibration target, and may computing a process calibration including toolpath adjustments for toolpaths based on the build platen 16 surface profile, the first layer 3D printed calibration target, the tolerance, and the scanned surface profiles of the build platen 16 and/or the first layer 3D printed calibration target. These process calibrations and/or adjustments may be recorded as a current environment calibration adjustment in either or both of the 3D printer or the inspection processor and may be particularly suitable for calibrating (e.g., adjusting some actuations made by) the printing deposition head and associated actuators, including motors and heaters. For example, toolpath adjustments may correct or calibrate for an effect of at least one of temperature, humidity or barometric pressure upon the printing material or the 3D printer itself (including the build platen 16, supports, gantry, rails, frame, and/or actuator drive or guide surfaces or actuation amounts). Alternatively or in addition, the same or other toolpath adjustments may correct or calibrate for an effect of at least one of 3D printer component wear (e.g., loss of surface finish, wearing away of contact surfaces), 3D printer component conditioning (e.g., development of surface oxides, corrosion, roughening), or 3D printer material property variation (e.g., diameter, material properties, or the like).

For example, in use, upon initiating a print job, the controller 20 and/or its inspection processor may control the X, Y, and/or Z motors 116, 118, 120 to raise the build platen 16 to a scanning height, and scan the build platen 16. The controller 20 and/or its inspection processor may determine an average height of the build platen and set a zero level, to which the initial printing layer may be referenced. However, if the build platen 16 height varies by, e.g., 150 microns, even if the zero level is set in the middle of the 150 micron range, for a printing height of 50 or 100 microns, some areas of the build platen 16 may be too high and others may be too low.

Optionally, the controller 20 and/or its inspection processor may control the laser scanner 15 moved together with the deposition head to scan the build platen 16 before, e.g., every print and calculate the contour of a difference between the build platen 16 contour and the X-Y support contour, in the current conditions of temperature or other environment. A reference plane or zero plane representative of the build platen 16 surface may be established, e.g., in the substantial center of the contour between the minimum and maximum build platen 16 surface height difference (or, e.g., between high and low points using another statistical reference such as a mean or median within +/−1, 2, or 3 standard deviations of the samples of the difference contour). Using this difference contour, upon the first layer to be printed, wherever in the X-Y motion of the deposition head the recorded difference contour indicates the build platen 16 is too low with respect to the (ideal surface) reference plane, the controller 20 and/or its inspection processor may move the height of the build platen 16 up to compensate. Where the build platen 16 is high, the controller 20 and/or its inspection processor may move the height of the build platen 16 down to compensate. As this compensation is performed at each or any X-Y position (or e.g., in zones), the deposition head deposits the first layer at the same height above the build platen 16.

Alternatively or in addition, to further compensate for deposition head volume deposition rate or deposition shape, simultaneously or after determining the difference contour, a calibration target bead may be deposited on the build platen 16 and the height of the calibration target bead from the build platen surface or difference contour scanned by the laser scanner 15. If the bead at the present, e.g., commanded volume deposition rate is not the same as the first layer height, a constant Z offset representing this bead size (e.g., for the first layer, or for many layers) may be used to print the layers (e.g., the deposition height is alternatively or in addition compensated according to the current bead height).

In many forms of 3D printing, this compensation is most effective on the first and near-first layers. Accordingly, optionally, the compensation is progressively attenuated over several layers (e.g., over 10 layers and/or 1 mm) until the printer is depositing in a plane parallel to the reference or zero plane. Preferably, one or both of these compensations are performed before every print job in order to detect and compensate for minute changes in the difference contour due to the components of the printer expanding/cooling over time, or otherwise changing over time, and compensate accordingly. As an additional benefit, the user can change build platens, deposition heads, or other system components and the same compensation will correct for variance.

In one exemplary process, the following steps may be performed before printing to set the build platen 16 both level and determine the difference contour.

(A) Heat or activate at least a portion of system components that may undergo dimensional change when heated or activated (e.g., nozzles) or that may heat other components of the printer in use. For example, deposition nozzles and/or build platen 16 may be pre-heated to operating ranges in this step.

(B) Scan the build platen 16 with the laser scanner 15 mounted to the deposition head in a regular pattern, e.g., zigzag, boustrophedon, or other motion to find the "build platen height (e.g., print bed height) in a grid to form a 3D or X-Y-Z difference contour (which may cover only a representative portion of the build platen 16, e.g., >¾ of the build platen 16.

(C) Calculate a best-fit or other statistical fit plane closest to the difference contour or recorded heights and determine the differential height of the fit plane at each of multiple support locations (e.g., a build platen 16 is generally supported at only 3 or 4 positions, ideally in 3-point contact, of which 2 or 3 may have adjustable heights to change the build platen 16 height). The fit plane may serve as the reference or zero plane.

(D) Calculate an average of the support locations, and provide a correction of the support locations with respect to the fit plane, e.g., as necessary, adjust at least one of the support locations so that all 3 points are adjusted to the average of the support locations. If this adjustment may not be made (e.g., because prior adjustments have moved the support locations too far from nominal), each of the support locations may be set to some nominal value permitting full+/−adjustment and the process begun again with the initial scan.

(E) Again scan the build platen 16 with the laser scanner 15 mounted to the deposition head in a regular pattern, e.g., zigzag, boustrophedon, or other motion to find the X-Y-Z difference contour, and/or reference plane.

Controller

The controller 20 controls the printing and laser scanning aspects of the apparatus 1000, including controlling the motors 116, 118, 120, the print head(s) 10, 18, and the laser scanner 15. The controller 20 operates the laser scanner 15 and collects data for measured surface profiles. The surface profiles may be collected or transmitted during an ongoing deposition, after part of a deposition, or after an entire deposition, or any combination—following the printing head, or independently of printing, or after the printing head has been deactivated following the completion of a shell or layer.

The controller 20 may be formed as a single processor or a set of multiple processors. For instance, the controller 20 may be formed of a combination of a user interface controller, print control processor, an image processing processor, a laser scanner control processor, and/or a general processor. In one embodiment, all processors of the controller 20 are locally provided in the apparatus 1000. In one embodiment, at least one processor of the controller 20 is located remote from the apparatus 1000. The controller 20 is coupled to the memory 21, which may include flash memory, RAM, and/or other volatile or non-volatile storage to store programs and active instructions for the controller 20 and data involved in operating the apparatus 1000.

The apparatus 1000 may further include an additional breakout board, which may include a separate microcontroller, that provides a user interface and connectivity to the controller 20. The apparatus 1000 may include an Ethernet controller that connects the controller 20 to a local wired network and/or an 802.11 Wi-Fi transceiver that connects the controller 20 to a local wireless network. These controllers may also connect the controller 20 to the Internet at large so as to send and receive remote inputs, commands, and control parameters. The apparatus 1000 may include a USB interface to connect the controller 20 to external peripherals or storage devices. The apparatus 1000 may include a touch screen display panel 128 to provide user feedback and accept inputs, commands, and control parameters from the user. The apparatus 1000 may include additional display(s), visual indicators (e.g., LEDs), and/or audio indicators (e.g., speaker) to indicate functionality and/or status to an operator, and may include additional input devices (e.g., keyboard, mouse, trackpad, buttons) to receive input from an operator.

Scanning Measurement Operation

FIG. 3 illustrates an operation for performing 3D-printing and measuring an object and generating updated design data, according to one embodiment.

First, in step S310, the controller 20 receives design data relating to the object to be printed. For instance, the controller 20 may retrieve the design data and load the data into memory 21. The design data may include information defining the geometry of the object to be printed. In one embodiment, the design data may be a computer-aided design (CAD) file.

In step S320, the controller 20 generates a first set of print instructions based on the design data received in step S310. These print instructions contain information for controlling the movement of the gantry 1010 and build platen 16, controlling the output of the print nozzlet 10a, and controlling other components, for producing the object to be printed. In one embodiment, the print instructions contain such information on a print layer-by-layer basis.

Figure 4:
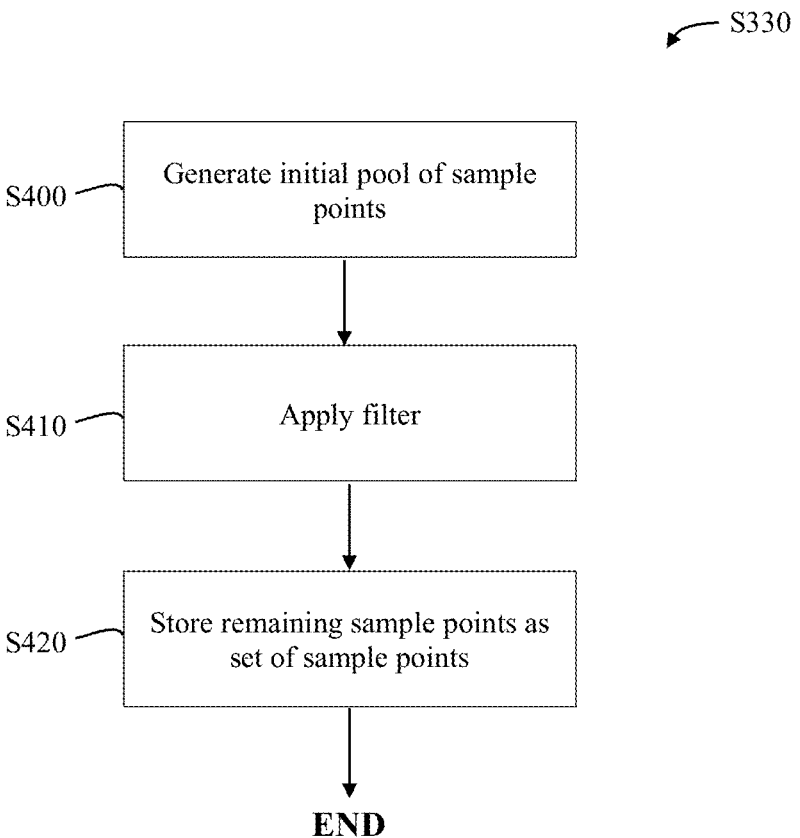
FIG. 4 is a flow chart for performing 3D-printing and measuring an object, in accordance with one embodiment.

In step S330, the controller 20 generates a set of sample points along the surface of the object as defined by the design data. The sample points are locations for performing a depth measurement. In one embodiment, the controller 20 generates the sample points by performing random sampling of points on the object as defined by the design data. In another embodiment, the controller 20 generates the sample points by performing a uniform sampling of points on the object as defined by the design data. In yet another embodiment, the controller 20 generates the sample points by performing the random or uniform sampling, and then applying a filter to the generated sample points to yield a desired distribution of sample points. One example of performing step S330 is illustrated in FIG. 4 and described in detail below.

In optional step S335, the controller 20 receives input from an operator of additional sample points on the surface of the object to add to the set of sample points generated in step S330. For instance, an operator may desire that the operation particularly scrutinizes a specific point or edge of interest on the object, and therefore may input such point or edge in the apparatus using one or more of the user interface inputs described above. Nonetheless, it will be appreciated that this step is optional, and in the event that the step is omitted, the operation may proceed directly from step S330 to step S340.

Figure 5:
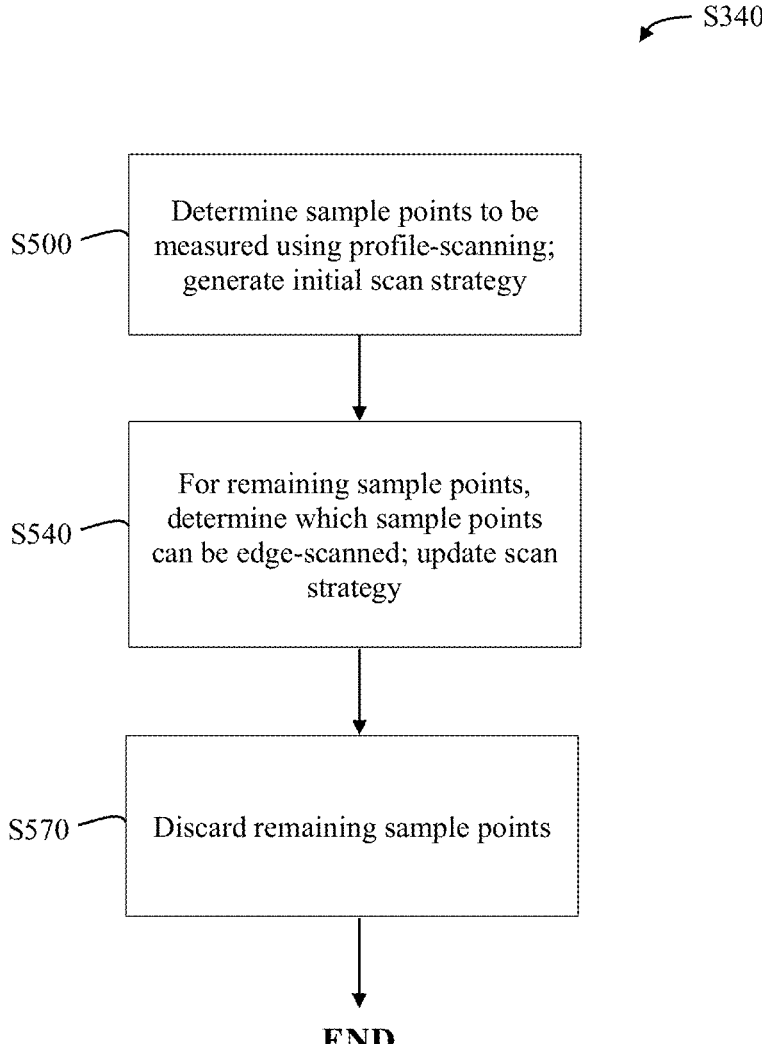
FIG. 5 is a flow chart for performing 3D-printing and measuring an object, in accordance with one embodiment.

In step S340, the controller 20 generates a scan strategy for conducting measurements during 3D-printing of the object, based on the sample points generated in step S330. The scan strategy may include one or multiple elements. For instance, in the case that the laser scanner 15 is operable in multiple modes (such as profile-scanning and edge-scanning), the controller 20 may determine an optimal mode to utilize for each sample point, and designate the optimal mode to the sample point. Additionally, the controller 20 may determine an optimal layer to perform the measurement of each sample point. Furthermore, the controller 20 may determine that the laser scanner 15 is not capable of accurately measuring one or more of the sample points. In this step, the controller 20 may also update the set of sample points, such as removing sample points from the set determined to be incapable of being accurately scanned by the laser scanner 15. One example of performing step S340 is illustrated in FIG. 5 and described in detail below.

In step S350, the controller 20 initiates the 3D-printing operation of the object, setting the current layer to be printed as the bottom-most print layer. In step S351, the controller 20 causes the print head(s) 10, 18 to print the current layer.

In step S352, the processor controller 20 determines, based on the set of sample points (as updated in step S340) and the scan strategy generated in step S340, the sample point(s) to be measured at the current layer. For each of these sample point(s), the controller 20 directs the laser scanner 15 to measure the sample point according to the scan strategy. For instance, where the scan strategy has designated that the sample point should be measured using a profile scan, the controller 20 directs the laser scanner 15 to measure the sample point using profile-scanning. And where the scan strategy has designated that the sample point should be measured using an edge scan, the controller 20 directs the laser scanner 15 to measure the sample point using edge-scanning. The controller 20 stores the results of the scan in the memory 21.

In step S353, the controller 20 determines whether another print layer remains to be printed for the object. If another print layer remains to be printed, the operation proceeds to step S354. If the current print layer is the final print layer, the operation proceeds to step S360.

In step S354, the controller 20 increments the current print layer to the next layer, thereby advancing to the next layer. Generally, the next layer is the successive layer upwards in height. The operation then returns to step S351.

In step S360, the controller 20 compares the measurement data stored for each of the sample points in the set, with expected data based on the geometry information in the design data. This comparison identifies the defects in geometry within the actual printed object relative to the specified geometry of the object as defined by the design data. In one embodiment, the controller 20 applies surface modeling methodologies to the design data, to determine the expected distance for each sample point.

In step S370, the controller 20 generates updated design data based on the design data and the results of the comparison from step S360. For example, the controller 20 may generate a transformation matrix defining the change from the expected data to the actual measured data for one or more sample points. The controller 20 may then apply the inverse of that transformation matrix to the design data, to generate the updated design data. In one embodiment, the controller 20 may compute more complex and sophisticated transformations based on the expected data and the actual measured data, to generate the updated design data. Since the updated design data is modified in light of the comparisons from step S360, it is expected that printing of the updated design data will produce an object with fewer geometry defects as compared to the current printed object that was measured.

It will be appreciated that in one embodiment, for profile-scanning and/or edge-scanning, the apparatus 1000 may perform a set of measurements across multiple layers in a single pass, rather than discriminating sample points strictly on a layer-by-layer basis.

Figure 8A:
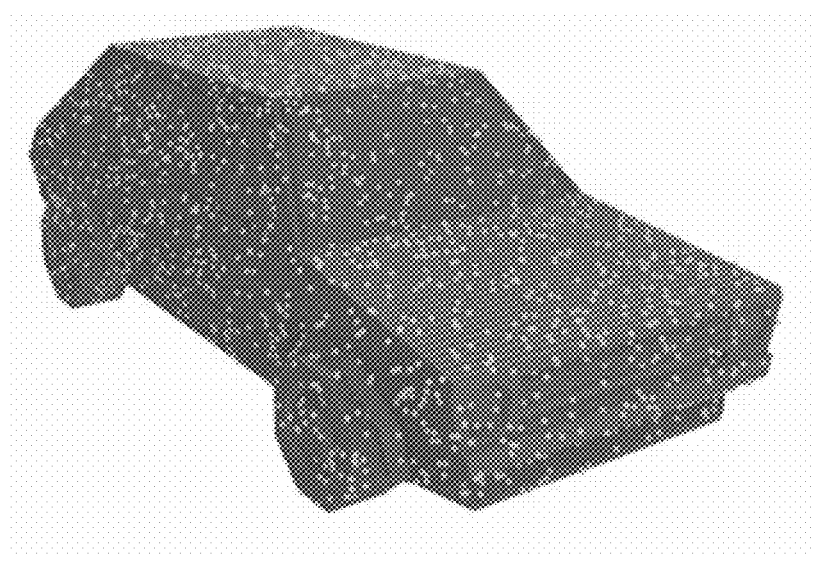
FIG. 8A illustrates an example of sample points for measurement on an object.

FIG. 4 illustrates one example of steps that may be employed to perform step S330 of generating a sample point set. In step S400, the controller 20 generates an initial pool of sample points. This sample point generation may be accomplished using a variety of known approaches, such as random sampling or uniform sampling of points on the surface of the object as defined by the design data. FIG. 8A illustrates an example of sample points (depicted as dots) that may be generated across the surface of an object to be printed. In one embodiment, the number of generated sample points in the initial pool is at least 2.5 times a maximum desired number of final sample points.

Figure 8B:
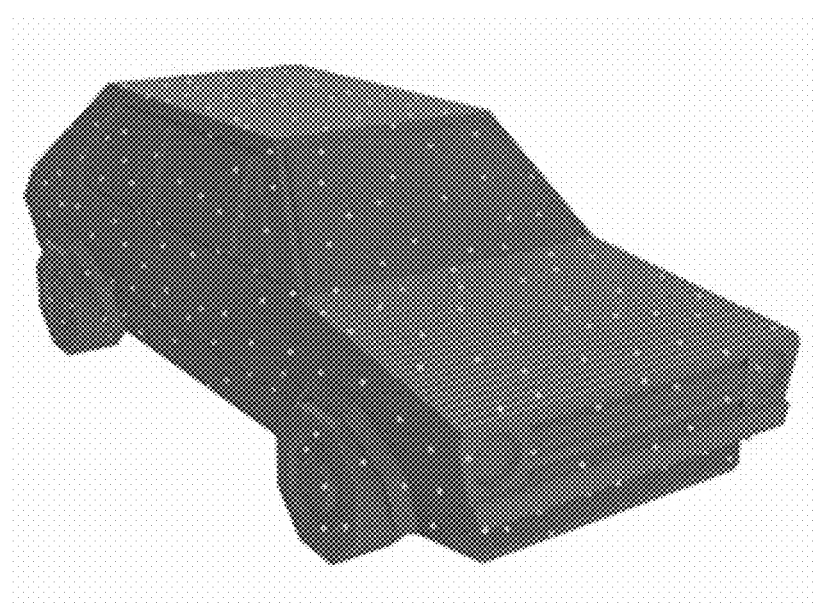
FIG. 8B illustrates an example of remaining sample points on an object after a filter is applied.

In step S410, the controller 20 applies a filter to the initial pool of sample points. The filter removes certain sample points from the pool, such that the final pool contains sample points that are distributed in a desired pattern. The particular filter to be applied will depend on the specific desired distribution, which in turn depends on individual preferences and priorities. For example, the filter may update the initial pool such that the final sample points are evenly distributed across the object. Or, the filter may update the initial pool such that certain areas of the object have a greater density of sample points. FIG. 8B illustrates an example of sample points remaining from the FIG. 8A example, following an application of a filter that produces an even distribution of sample points.

In step S420, the controller 20 stores, in the memory 21, the final pool of sample points as the set of sample points to be measured.

It will be appreciated that the steps illustrated in FIG. 4 is merely one example of performing step S330, and that any known approach to generating a sample point set may be used to perform step S330.

FIG. 5 illustrates one example of steps that may be employed to perform step S340 of generating a scan strategy and updating the sample point set. In step S500, the controller 20 determines which sample points, of the set of sample points, will be measured using a profile scan. The controller 20 also generates an initial scan strategy that includes information for profile-scanning these sample points. One example of performing step S500 is illustrated in FIG. 6A and described in detail below.

In step S540, the controller 20 determines which sample points, of the remaining sample points in the set that will not be profile-scanned, will be measured using an edge scan. The controller 20 also updates the scan strategy to include information for edge-scanning these sample points. One example of performing step S540 is illustrated in FIG. 6B and described in detail below.

In step S570, the controller 20 discards the remaining sample points from the set that have not been designated for profile-scanning in step S500 or edge-scanning in step S540. These sample points have been determined as being incapable of being successfully measured by the laser scanner 15.

It will be understood that the laser scanner 15 may have additional modes, or the apparatus 1000 may have additional components in addition to the laser scanner 15 for measuring the object. Therefore, it will be appreciated that step S340 may be modified to accommodate these modes or components, and to generate a scan strategy that incorporates sample point measurement based on these modes or components, without deviating from the invention.

FIG. 6A illustrates one example of steps that may be employed to perform step S500 of determining the sample points to be measured using profile-scanning and generating a scan strategy. As described above, profile-scanning is generally preferred over edge-scanning, but is generally limited to sample points which lie on a relatively flat surface and are not located near an edge. For instance, profile-scanning may not provide an accurate measurement if the sample point is shadowed by a ridge, which can occur if the sample point is in a depression (e.g., indentation or hole) relative to its surrounding surface.

In step S511, the controller 20 generates an initial candidate pool of sample points being considered for profile-scanning. In one embodiment, the initial candidate pool is simply the set of sample points generated in step S330, as profile-scanning is a preferred scan mode based on its scan speed relative to edge-scanning.

In step S512, the controller 20 discards, from the candidate pool, sample points which lie on a slope steeper than a threshold slope. As described above, profile-scanning may not be capable of accurately measuring sample points on steep slopes. Therefore, these sample points may preferably be excluded from profile-scanning. The controller 20 may perform step S512 by calculating the slope of the surface on which each sample point in the candidate pool is located. The slope may be calculated based on, for example, surface modeling of the object as defined by the design data. The controller 20 may then compare each calculated slope with a threshold slope, and remove sample points from the candidate pool for which the corresponding calculated slope exceeds the threshold slope. In one embodiment, the specific threshold slope is predetermined based on various conditions, such as the limitations of the laser scanner 15, the desired confidence of profile-scanning measurement accuracy, and the nature of the deposition print material.

Figure 9A:
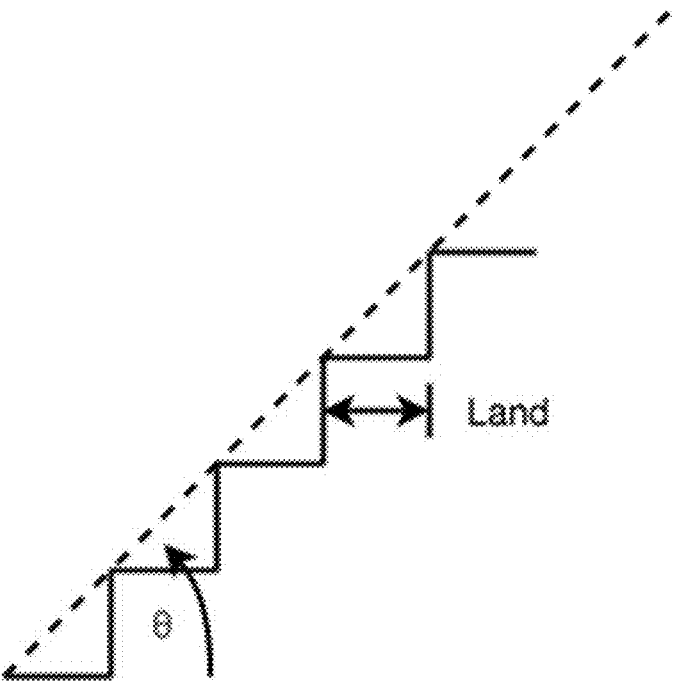
FIG. 9A illustrates an example surface topology.

In step S513, the controller 20 discards, from the candidate pool, sample points having exposed roof regions smaller than a threshold. In one embodiment, the threshold is predetermined based at least on the spot size of the laser beam emitted by the laser emitter. Excessively small exposed roof regions prevent the emitted laser beam incident on the sample point from being useful and sufficiently detectable by the laser receiver 15*b*. Therefore, these sample points may preferably be excluded from profile-scanning. FIG. 9A illustrates an example of a topology and how the slope θ and the width of the exposed roof region ("land") on the topology influences the ability of the laser scanner 15 to profile-scan a location. If the slope θ is excessive or the land is inadequate, the laser beam spot from the laser scanner 15 may not be incident on the topology surface in a manner that can accurately reflect the depth from a scan of that location.

In step S514, the controller 20 establishes a scan strategy that designates the remaining sample points in the candidate pool for profile-scanning. The scan strategy contains information pertaining to performing measurements of the object, such as the sample points to be measured, the mode in which each sample point will be measured, and the print layer during which each measurement will be performed. That is, the scan strategy will be employed during the scanning and printing operation to dictate the manner of measuring the object being printed.

Figure 9B:
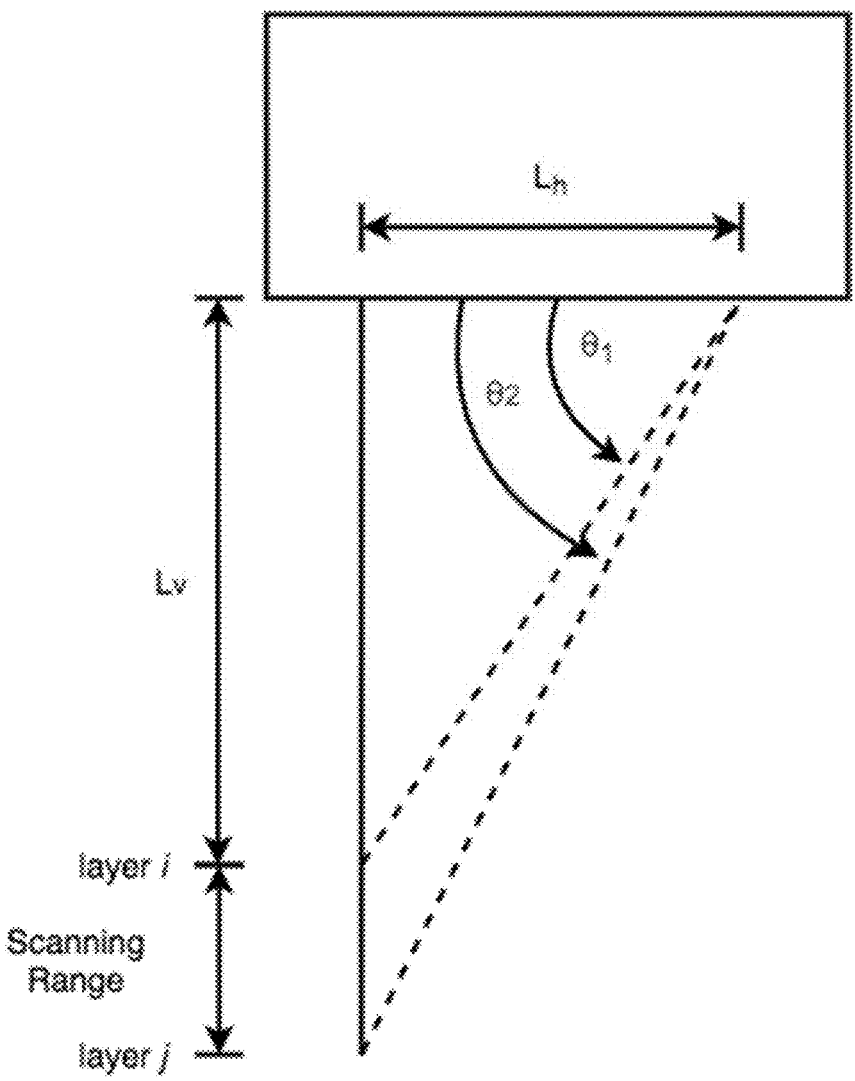
FIG. 9B illustrates a scanning range of depths of the laser scanner.
Figure 9C:
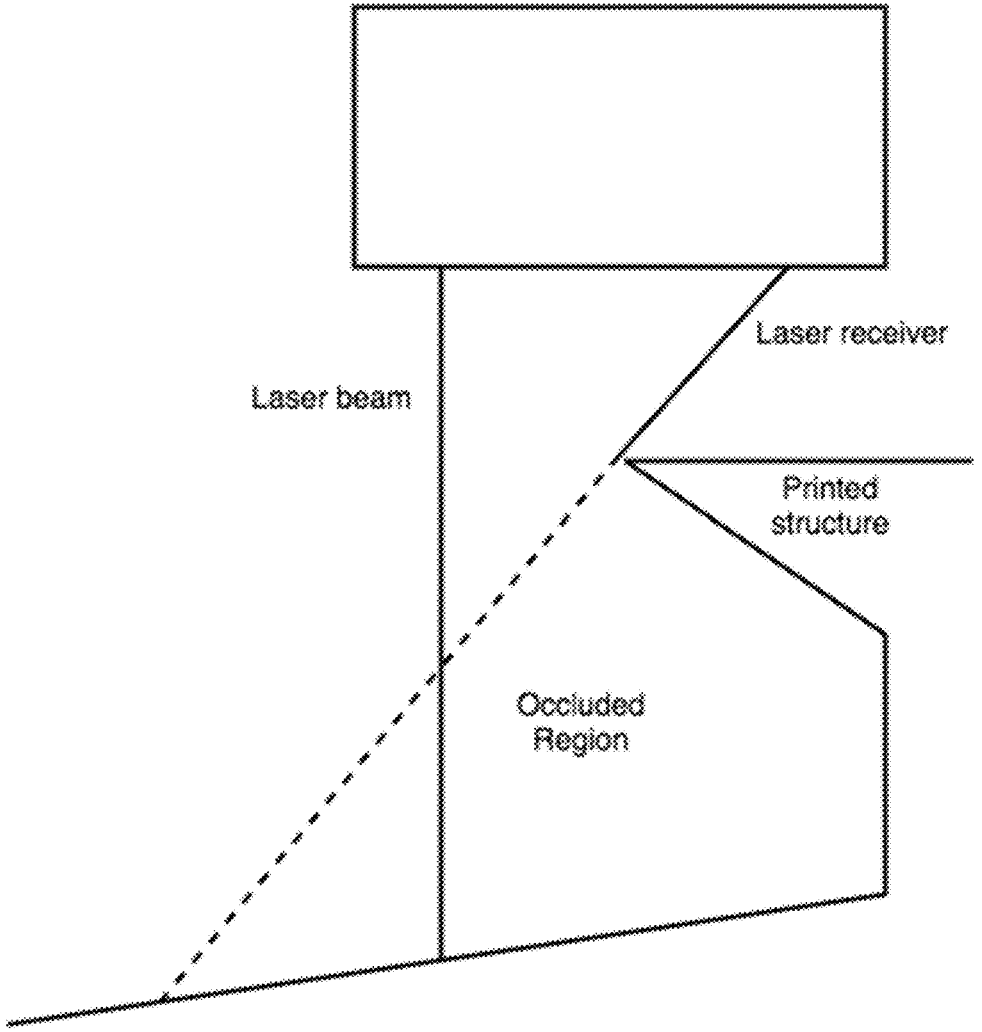
FIG. 9C illustrates an example of an occluded region of a laser scanner.

In step S520, the controller 20 determines, for each print layer, which of the sample points below that layer are visible to the laser receiver. For instance, as illustrated in FIG. 9B, when the laser emitter 15a and the laser receiver 15b of the laser scanner 15 are spaced a distance $L_h$ from each other, the laser scanner 15 may possess a scanning depth range from layer i (at a distance of Lv from the laser scanner 15) down to layer j, based on angles $\theta_1$ and $\theta_2$. This scanning range provides the ability for the laser scanner 15 to, when scanning sample points on layer i, possibly also scanning other sample points down to layer j. However, as illustrated in FIG. 9C, higher layers may form overhangs which occlude portions of a lower layer, preventing sample points on those occluded portions to be measured once the overhang is formed. Therefore, such determination in this step is useful to ensure that measurement of such occluded sample points is performed prior to formation of the layer containing the overhang.

In step S521, the controller 20 determines an optimal approach to conducting the overall operation of profile-scanning the sample points so designated. The optimal approach may include the order and timing for profile-scanning the designated sample points, where the timing may include the optimal print layer from which to conduct the profile scan. The processor may incorporate one of various methodologies relating to solving a set cover problem. The precise methodology and optimization may depend on desired objectives and their relative importance. Various objectives may include whether scans should preferably be conducted at even intervals, whether scans should preferably be conducted in as few layers as possible, whether scans should preferably be conducted multiple times or from multiple layers, etc.

In step S522, the controller 20 updates the scan strategy to assign, for each sample point that has been designated for profile-scanning, the print layer for performing the profile-scanning. In particular, the controller 20 processes the optimal approach determined in step S521 to extract the optimal print layer to perform the measurement of each sample point designated for profile-scanning, and incorporates this information into the scan strategy. Optionally, the controller 20 may also update the scan strategy to include a scan path for each print layer that will be traversed so as to pass over the relevant sample points for that layer.

FIG. 6B illustrates one example of steps that may be employed to perform step S540 of determining the sample points to be measured using edge-scanning and updating the scan strategy. In step S541, the controller 20 generates an initial candidate pool of sample points being considered for edge-scanning. In one embodiment, the initial candidate pool simply consists of the remaining sample points in the sample point set that have not already been designated for profile-scanning.

In step S542, the controller 20 discards, from the candidate pool, sample points for which no scan path exists for performing the edge scan. That is, the controller 20 determines that the nature of the edge (e.g., its geometry or profile) renders edge-scanning ineffective. This may occur for example, if the edge is located on a narrow sliver of material, is proximate to other edges, or has a unique profile that prevents edge-scanning In step S543, the controller 20 updates the scan strategy to designate the remaining sample points in the candidate pool for edge-scanning.

Figure 10B:
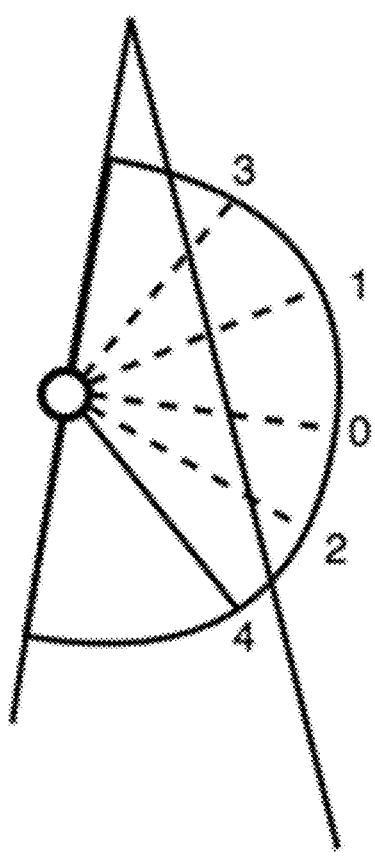

In step S544, the controller 20 determines, for each sample point designated for edge-scanning, an optimal scan path for performing the edge scan. For instance, FIG. 10A illustrates an overhead view of an example edge and two potential scan paths for performing an edge scan of the edge in different directions, while also illustrating the scan signals that are produced by such scan paths. In one embodiment, the determination of the optimal scan path involves the determination of the optimal length of the scan path. For instance, a shorter scan path length may reduce the time needed to perform the edge scan, but may yield insufficient measurement data in which to discriminate the edge. In one embodiment, the determination of the optimal scan path involves the determination of the optimal angle relative to the edge. For instance, FIG. 10B illustrates an overhead view of potential scan path angles 0 through 4 from which an optimal angle may be selected. It will be appreciated that the specific optimization methodology for determining optimal scan paths may depend on various objectives and their relative importance, such as the desired scan speed, the limitations of the laser scanner, the desired confidence of edge-scan measurement accuracy, and the nature of the deposition print material.

In step S545, the controller 20 determines an optimal approach to conducting the overall operation of edge-scanning the sample points so designated. The optimal approach may include the order and timing for edge-scanning the designated sample points, where the timing may include the optimal print layer from which to conduct the edge scan. This step may incorporate the same or similar methodology as step S521 described above for profile-scanning. That is, the processor may incorporate one of various methodologies relating to solving a set cover problem, where the precise methodology and optimization may depend on desired objectives and their relative importance. Various objectives may include whether scans should preferably be conducted at even intervals, whether scans should preferably be conducted in as few layers as possible, whether scans should preferably be conducted multiple times or from multiple layers, etc. The controller 20 may also incorporate the existing scan strategy formulated for profile-scanning into its optimization analysis.

In step S546, the controller 20 updates the scan strategy to assign, for each designated sample point, (i) the optimal scan path for the sample point determined in step S544, and (ii) the print layer for edge-scanning the sample point based on the optimal approach determined in step S545.

Figure 11:
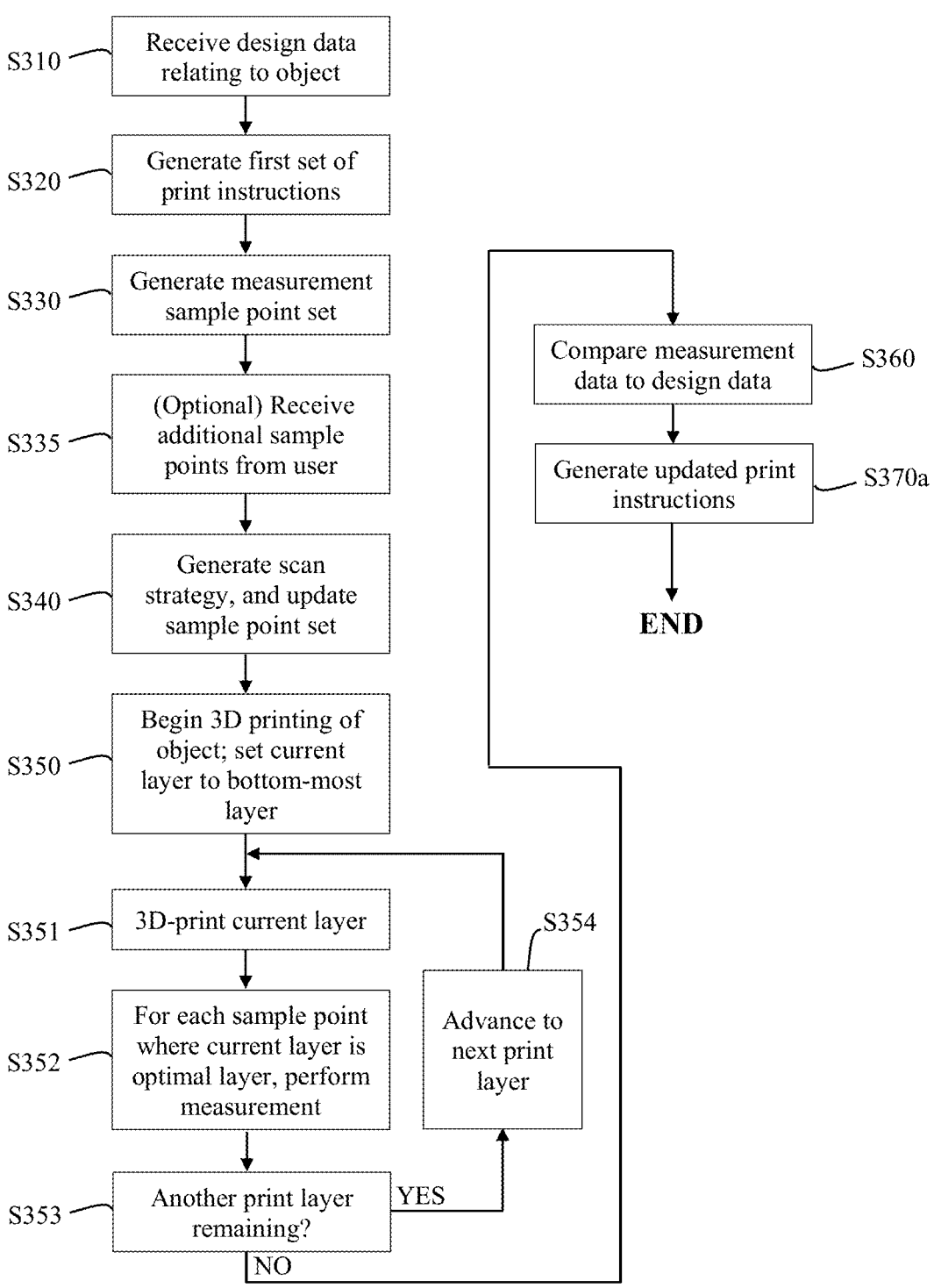
FIG. 11 is a flow chart for performing 3D-printing and measuring an object, in accordance with another embodiment.

FIG. 11 illustrates an operation for performing 3D-printing and measuring an object and generating updated print instructions, according to another embodiment. The FIG. 11 embodiment differs from the FIG. 3 embodiment in that the comparison information between the measurement data and the design data is used to generate updated print instructions rather than updated design data. As a result, step S370 in FIG. 3 has been replaced with step S370a in FIG. 11. It will be appreciated that the same reference numerals utilized in FIG. 3 are again utilized in FIG. 11 to denote the same steps.

In step S370a, the controller 20 generates updated print instructions based on the first set of print instructions and the results of the comparison from step S360. For example, the controller 20 may generate a transformation matrix defining the change from the expected data to the actual measured data for one or more sample points. The controller 20 may then apply the inverse of that transformation matrix to the first set of print instructions, to generate the updated print instructions. In one embodiment, the controller 20 may compute more complex and sophisticated transformations based on the expected data and the actual measured data, to generate the updated print instructions. Since the updated print instructions are modified in light of the comparisons from step S360, it is expected that printing based on the updated print instructions will produce an object with fewer geometry defects as compared to the current printed object that was measured.

FIG. 12 illustrates an operation for performing 3D-printing and measuring an object and generating updated design data, according to yet another embodiment. The FIG. 11 embodiment differs from the FIG. 3 embodiment in that the measuring of the sample points is performed only after the object has been fully printed, rather than being performed during the printing operation. As a result, step S340 in FIG. 3 has been replaced with step S340a in FIG. 12, step S351 in FIG. 3 has been omitted, and step S355 has been added.

In step S340a, the controller 20 generates a scan strategy for performing measurements after the object has already been 3D-printed, based on the sample points generated in step S330. The scan strategy may include one or multiple elements. For instance, in the case that the laser scanner 15 is operable in multiple modes (such as profile-scanning and edge-scanning), the controller 20 may determine an optimal mode to utilize for each sample point, and designate the optimal mode to the sample point. Furthermore, the controller 20 may determine that the laser scanner 15 is not capable of accurately measuring one or more of the sample points. In this step, the controller 20 may also update the set of sample points, such as removing sample points from the set determined to be incapable of being accurately scanned by the laser scanner 15.

In step S355, the controller 20 directs the laser scanner 15 to measure each of the sample points in the set according to the scan strategy. For instance, where the scan strategy has designated that the sample point should be measured using a profile scan, the controller 20 directs the laser scanner 15 to measure the sample point using a profile scan. And where the scan strategy has designated that the sample point should be measured using an edge scan, the controller 20 directs the laser scanner 15 to measure the sample point using an edge scan. The controller 20 stores the results of the scans in the memory 21.

Figure 13:
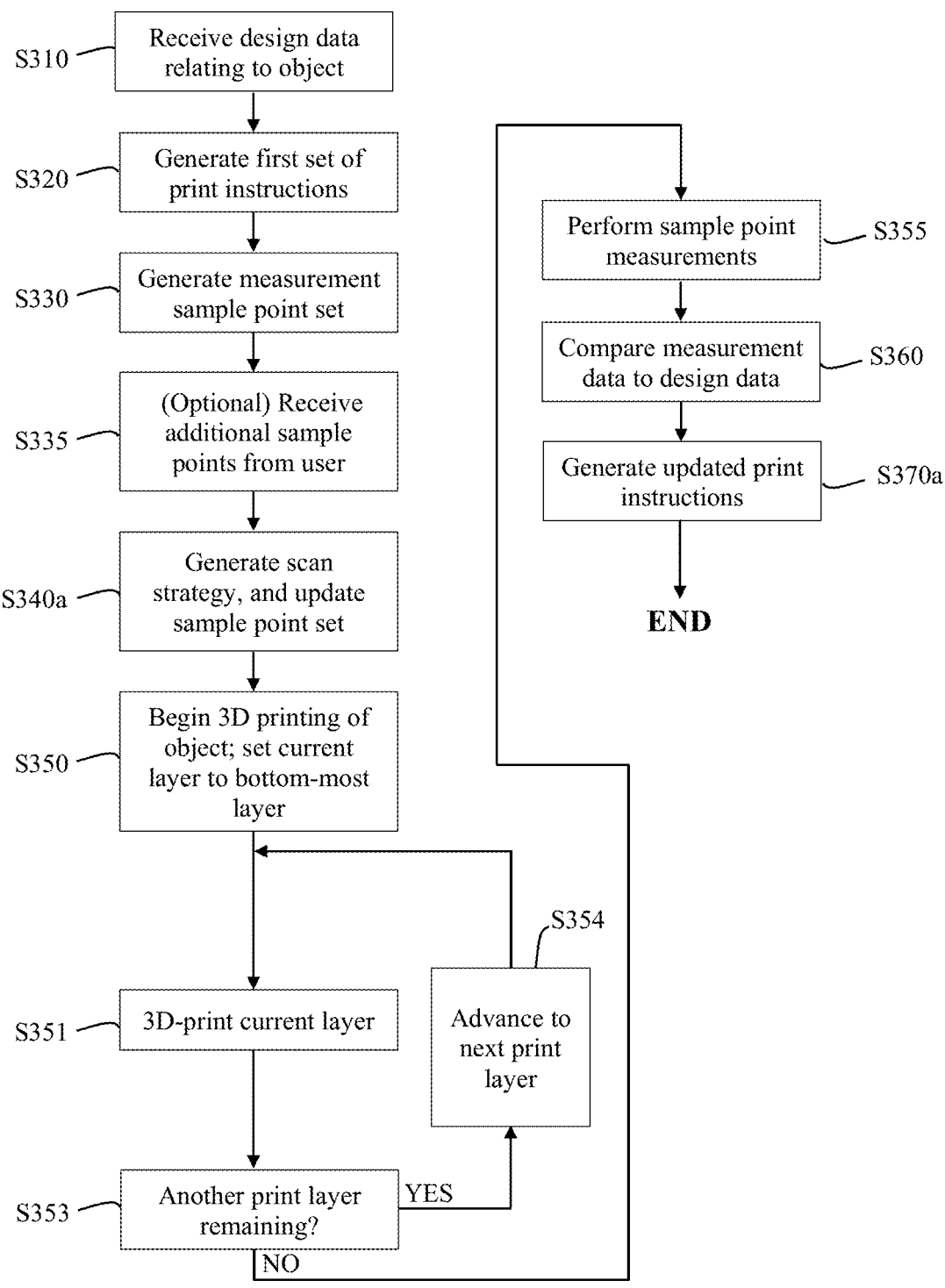
FIG. 13 is a flow chart for performing 3D-printing and measuring an object, in accordance with still another embodiment.

FIG. 13 illustrates an operation for performing 3D-printing and measuring an object and generating updated print instructions, according to still yet another embodiment. The FIG. 13 embodiment differs from the FIG. 3 embodiment by incorporating both the unique aspects of the FIG. 11 embodiment and those of the FIG. 12 embodiment, in that (i) the comparison information between the measurement data and the design data is used to generate updated print instructions rather than updated design data, and (ii) the measuring of the sample points is performed only after the object has been fully printed, rather than being performed during the printing operation.

While the above operations have been described based on a single measuring and printing of an object to generate updated design data or print instructions, in one embodiment, the operation may utilize an iterative approach involving multiple repeated measurements and re-printings of objects. In such an approach, each successive re-print ideally produces a printed product increasingly closer to the intended design (as defined by the original design data).

In yet another embodiment, the apparatus performs in-process correction in combination with the measurement operations, to preemptively correct printing defects during printing to minimize defects in the remaining portion of the object being printed. While such an approach still results in a certain extent of printing defects (which may still render the printed object unacceptable), this approach may reduce the total extent of printing defects required to be corrected. As a result, by combining in-process correction with corrections based on the sample point measurement operation, an acceptable object re-print may be achievable with an ultimately fewer number of re-prints.

In still another embodiment, the apparatus takes the measurements at all X-Y points (or at X-Y points spaced at certain intervals), for all print layers. With such an approach, the controller 20 may use the measurement data to construct a full three-dimensional model of the printed object. The full three-dimensional model may include geometries defining reference layers, walls, infill (e.g. triangular, hexagonal), etc.

While the above operations have been described with respect to the laser scanner 15, it will be appreciated that the invention encompasses the use of other measurement approaches. For instance, in one embodiment, the apparatus 1000 includes a camera for imaging every print layer and reconstructing a three-dimensional model from the image data.

In one embodiment, the apparatus 1000 is incorporated with a three-dimensional measurement component such as an X-ray computed tomography (CT) device to perform the measurements during printing. For instance, the apparatus 1000 may be placed within an X-ray CT machine to perform the measurements.

In one embodiment, the partial or fully-complete printed object is placed in a non-destructive measurement device to perform the measurements. In one embodiment, the partial or fully-complete printed object is placed in an X-ray CT device to perform the measurements.

Gantry Error Detection and Compensation

Another aspect of the invention is an apparatus and method for detecting and compensating for gantry positioning errors. It will be appreciated that this aspect may be used in combination with the above-described apparatuses and methods of performing 3D-printing and scanning of an object and the below-described apparatuses and methods for detecting and compensating for backlash.

One problem that may arise with movement systems, such as a gantry with an X rail and a Y rail, is that the actual positioning of a movement head does not precisely correspond to the intended positioning inputs. For instance, if the X rail and Y rail of the gantry 1010 are not precisely aligned at 90 degrees with respect to each other, the gantry's X-Y coordinate system will be skewed relative to a true X-Y coordinate system. Additional low-order positioning deviations such as rotation, translation, and scale, could also exist between these coordinate systems. Furthermore, higher-order and/or localized positioning deviations could also exist between these coordinate systems, such as bowed gantry rails and/or backlash.

Such gantry deviations may influence both the measurement and printing operations described above, resulting in inaccuracies in both the scanning process and the printed object. Therefore, a need exists in the art to detect such gantry deviations as gantry errors and compensate for such errors, so that the apparatus may perform accurate measurement and printing operations.

One aspect of the present invention includes a reference bed that is installed on the apparatus, and an operation for detecting features on the reference bed to determine gantry errors. The present invention also incorporates an operation for compensating for the detected gantry errors during normal operation of the apparatus.

Figure 14:
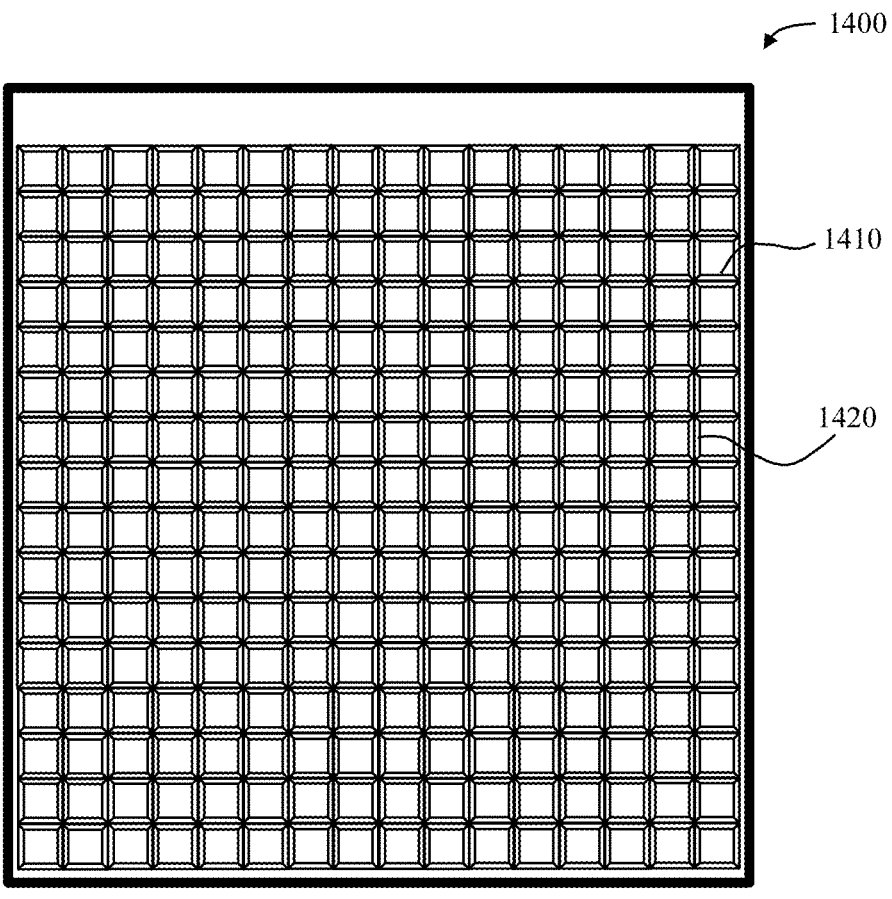
FIG. 14 illustrates a reference bed, in accordance with one embodiment.

FIG. 14 illustrates a reference bed 1400 that may be used in combination with an operation for detecting gantry errors. In one embodiment, the reference bed 1400 includes mounting hardware, such as bolts, that is compatible with mounting hardware of the build platen 16 of the apparatus 1000. As such, the reference bed may be attached to the apparatus 1000 in place of the print head when performing an operation to detect gantry errors. In one embodiment, the reference bed 1400 has the same thickness, general shape, and/or weight as the build platen 16.

The reference bed 1400 includes a plurality of grooves on its surface. In one embodiment, the grooves are arranged in a grid pattern, including both grooves 1410 running along the horizontal (X) direction and grooves 1420 running along the vertical (Y) direction. In one embodiment, the grooves running along each direction are spaced at equal intervals from one another.

Figure 15:
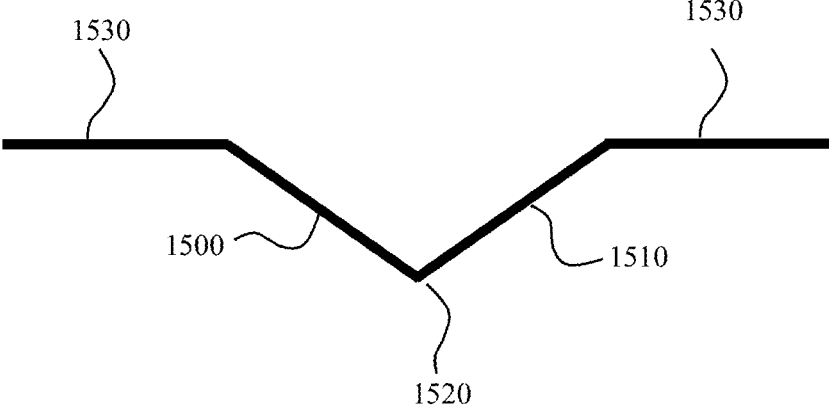
FIG. 15 is a sectional view of a reference bed groove in accordance with one embodiment.

FIG. 15 illustrates, in a sectional view, the profile of one example of a groove on the reference bed 1400. In one embodiment, the profile of each groove includes a left slope 1500 and a right slope 1510 intersecting at a center point 1520, thereby forming a V-shape into a top surface 1530 of the reference bed. In one embodiment, the left slope 1500 and the right slope 1510 are symmetrical, and the center point 1520 reflects the center of the groove. It will be appreciated that the specific number of grooves, groove depths and widths, and intervals between grooves may be selected based on various design considerations.

In one embodiment, the grooves are manufactured so as to be sufficiently straight and evenly spaced, such that the centers of the groove intersections form a sufficiently square grid. While it will be appreciated that realistic manufacturing limitations prevent an absolutely "perfect" groove, the reference bed 1400 and its grooves are still preferably manufactured with at least sufficiently close tolerances which exceed the measurement resolution of the laser scanner 15. That is, the grooves are "perfectly" straight and evenly spaced from the perspective of the laser scanner's ability to detect them.

In one embodiment, the reference bed 1400 is formed of a material with a low coefficient of thermal expansion. In one embodiment, the reference bed 1400 is formed of aluminum. In one embodiment, the reference bed 1400 is formed of a material with a known coefficient of thermal expansion, and preferably at a known and/or controlled temperature.

In the above description, the grooves 1410, 1420 in the reference bed 1400 are arranged in a grid pattern, primarily due to its simplicity and convenience. However, it will be appreciated that the grooves 1410, 1420 in the reference bed 1400 may alternatively be formed with other patterns of grooves, so long as the geometry of those patterns is known when performing the detection operation described below.

Figure 16:
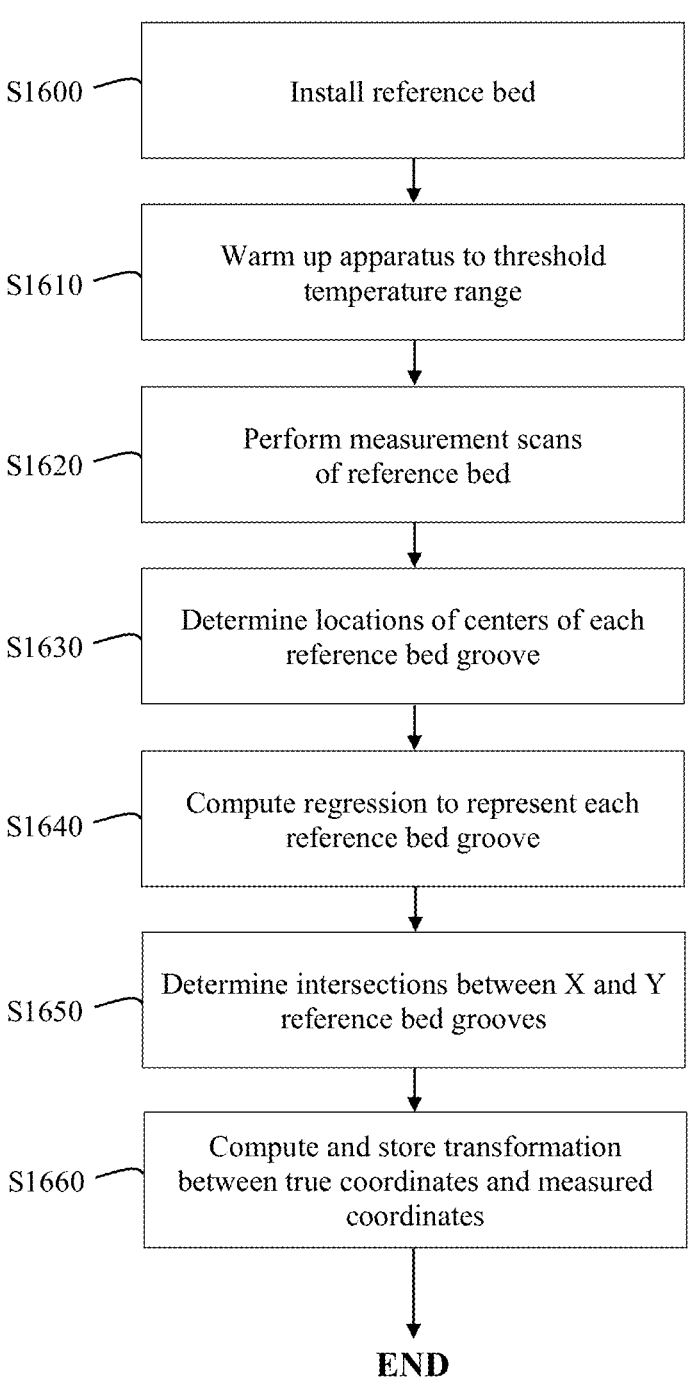
FIG. 16 is a flow chart for detecting gantry errors, in accordance with one embodiment.

FIG. 16 illustrates an operation for detecting gantry errors attributable to the gantry 1010 of the apparatus, according to one embodiment. In step S1600, an operator installs the reference bed 1400 on the apparatus. In one embodiment, the reference bed 1400 temporarily replaces the build platen 16 used during normal operation.

In step S1610, the apparatus and the reference bed are warmed up to a threshold temperature range. This step ensures that the reference bed characteristics do not deviate from its design due to thermal expansion during scanning, and ensures the calibration is representative of a printer while it is printing (as opposed to a cold printer).

In step S1620, the apparatus 1000 performs measurement scans along the surface of the reference bed using the laser scanner 15. In one embodiment, the laser scanner 15 performs measurement scans in both X and Y directions to detect the positions of the reference bed grooves. For instance, to detect the positions along a particular X position of the horizontal grooves 1410, the laser scanner 15 may scan along the Y direction while holding at the particular X position, taking depth measurements at intervals along the Y direction. As described below, these depth measurements may be employed to detect the centers of all horizontal grooves 1410 at the particular X position. The laser scanner may repeat these Y-direction scans at multiple X positions (e.g., at predetermined intervals along the X direction) to detect the positions of the horizontal grooves 1410 throughout the entire reference bed 1400.

To detect the positions along a particular Y position of the vertical grooves 1420, the laser scanner 15 may scan along the X direction while holding at the particular Y position, taking depth measurements at intervals along the X direction. As described below, these depth measurements may be employed to detect the centers of all vertical grooves 1420 at the particular Y position. The laser scanner may repeat these X-direction scans at multiple Y positions (e.g., at predetermined intervals along the Y direction) to detect the positions of the vertical grooves 1420 throughout the entire reference bed 1400.

In one embodiment, the laser scanner 15 performs the X-direction and Y-direction scans using the profile-scanning mode described above, while continuously moving in the respective scan direction to conduct the scan. In one embodiment, the left slope 1500 and the right slope 1510 of each groove has a slope sufficiently flat such that the laser scanner 15 may accurately profile-scan sample points on the slopes.

Figure 17:
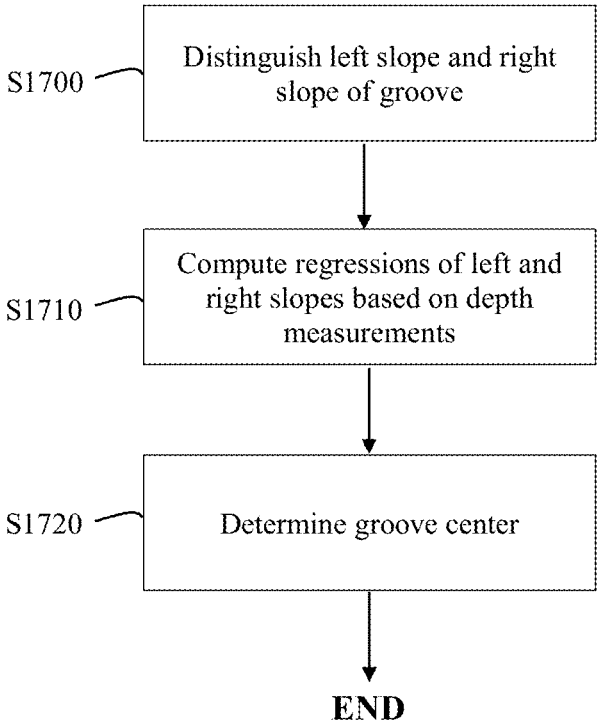
FIG. 17 is a flow chart for detecting gantry errors, in accordance with one embodiment.

In step S1630, the controller 20 determines the locations of centers of each reference bed groove for the scan measurement data collected in step S1620. That is, for each Y-direction scan along each X position, the controller 20 determines the center point 1520 of each horizontal groove 1410 at that X position. And, for each X-direction scan along each Y position, the controller 20 determines the center point 1520 of each vertical groove 1420 at that Y position. Various known approaches for analyzing the topologies of the measurement scans may be employed for this determination, such as algorithms used for surface and topographical analysis. Alternatively, one novel example of performing step S1630 that may yield more accurate groove center point determinations is illustrated in FIG. 17 and described in detail below.

In step S1640, the controller 20 computes a regression to represent each horizontal groove 1510 and vertical groove 1520. That is, for each horizontal groove 1510, the determinations made in step S1630 reveal the Y positions of the groove center along the X direction. In the case that no gantry errors are present, the Y positions for the groove center of the horizontal groove 1510 will remain constant along the X direction (i.e., perfectly horizontal). On the other hand, in the case that the X-rails and Y-rails are skewed (i.e., not perfectly aligned at 90 degrees), the Y positions for the groove center of the horizontal groove 1510 will change along the X direction. The controller 20 computes a regression representing that horizontal groove 1510 from these X and Y positions of the groove center.

Similarly, for each vertical groove 1520, the determinations made in step S1630 reveal the X positions of the groove center along the Y direction. In the case that no gantry errors are present, the X positions for the groove center of the vertical groove 1520 will remain constant along the Y direction (i.e., perfectly vertical). On the other hand, in the case that the X-rails and Y-rails are skewed (i.e., not perfectly aligned at 90 degrees), the X positions for the groove center of the vertical groove 1520 will change along the Y direction. The controller 20 computes a regression representing that horizontal groove 1510 from these X and Y positions of the groove center.

The specific regression employed for this step may depend on the desired accuracy. In one embodiment, a linear regression is used for this step. In one embodiment, a higher-order (e.g., polynomial) regression is used for this step.

In step S1650, the controller 20 determines the locations of intersection points between horizontal grooves 1510 and vertical grooves 1520, based on the regressions computed in step S1640. In one embodiment, the controller 20 generates a two-dimensional array of the X-Y locations of intersection points between horizontal grooves 1510 and vertical grooves 1520.

In step S1660, the controller 20 computes, and stores in the memory 21, a transformation representing the positioning offsets between the true X-Y coordinate system and the measured X-Y coordinate system of the gantry. In one embodiment, the controller 20 determines the transformation based on deviations between (i) the X-Y locations of the groove intersections determined in step S1650 and (ii) the expected X-Y locations of the groove intersections according to the design of the reference bed 1400. In one embodiment, the transformation accounts for one or more types of deviations including translation, scale, shear/skew, and rotation. In one embodiment, the transformation accounts for global deviations. In one embodiment, the transformation accounts for both global deviations and localized deviations. It will be appreciated that translation, scale, shear/skew, and rotation are generally global deviations, while other deviations (e.g., resulting from a bowed axis rail) may be treated as either a series of localized deviations or a higher order global deviation.

In one embodiment, the computed transformation is formed as one or more transformation matrices. In one embodiment, the computed transformation is formed as individual offset amounts corresponding to multiple X-Y locations distributed across the gantry.

In one embodiment, the above-described gantry error detection operation is performed once for an apparatus during the manufacturing process to compute the transformation. In one embodiment, the operation is performed periodically (e.g., during maintenance cycles or at intervals between a number of successive printing operations). In one embodiment, the operation is performed prior to every printing operation.

In one embodiment, a single measurement of the reference bed is performed. In one embodiment, multiple measurements of the reference bed are performed, and a transformation is generated based on the multiple measurements.

FIG. 17 illustrates one example of steps that may be employed to perform step S1630 of determining the locations of the center of each groove. The inventors recognized that determining the precise location of a groove center from depth measurements themselves may be difficult, due to resolution limitations and noise. For example, the depth measurements, by themselves, may not locate an accurate groove center unless a depth measurement is conducted precisely at the groove center location. Therefore, a need exists to more precisely identify the location of the groove center.

In step S1700, the controller 20 distinguishes, at least on a coarse basis, the areas of the left and right slopes of each V-shaped groove using measurements taken along a scan by the laser scanner 15. For instance, with reference to FIG. 15, the controller 20 may distinguish the left slope 1500 based on continually increasing depth measurements during a measurement scan moving from left to right. The controller 20 may distinguish the right slope 1510 based on subsequent depth measurements that begin to decrease after encountering the left slope 1500.

Figure 18:
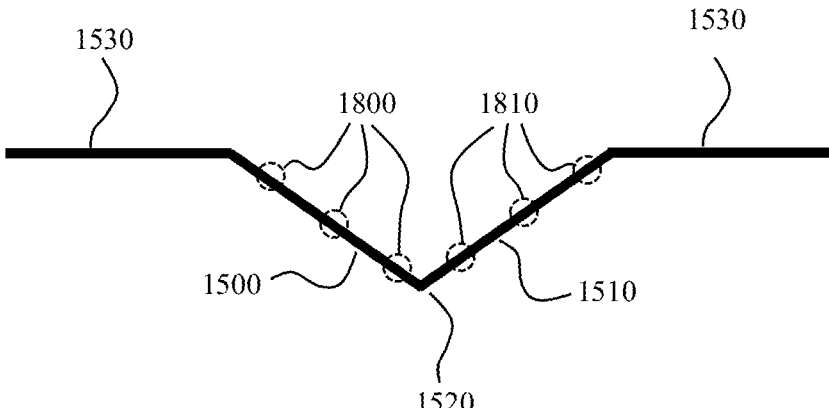
FIG. 18 is a sectional view of a reference bed groove and sample points, in accordance with one embodiment.

In step S1710, the controller 20 isolates the depth measurements falling within the area of the left slope 1500 as distinguished in step S1700 (examples illustrated in FIG. 18 as depth measurements 1800), and computes a regression representing the left slope 1500 based on these depth measurements. The controller 20 also isolates the depth measurements falling within the area of the right slope 1510 as distinguished in step S1700 (examples illustrated in FIG. 18 as depth measurements 1810), and computes a regression representing the right slope 1510. In one embodiment, the computed regressions are linear regressions. In one embodiment, the computed regressions are higher-order (e.g., polynomial) regressions.

In step S1720, the controller 20 determines the groove center 1520 based on the intersections of the two regressions computed in step S1710. Using this approach, the groove center 1520 may be accurately determined even if that precise location was not subject to a depth measurement during the measurement scan, and sub-scan resolution positioning accuracy may be realized.

Figure 19:
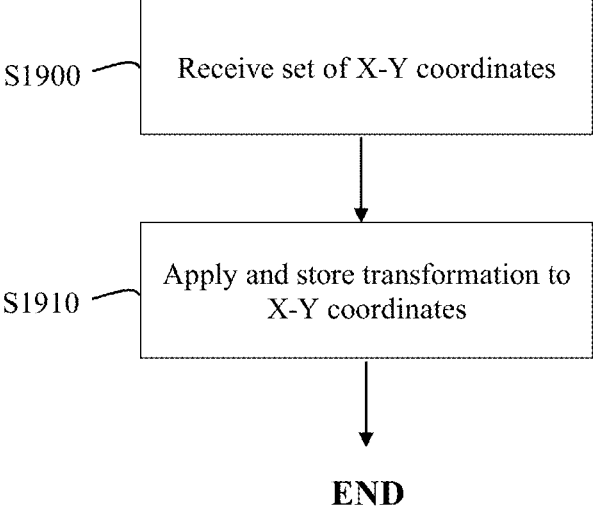
FIG. 19 is a flow chart for compensating for gantry errors, in accordance with one embodiment.

FIG. 19 illustrates one example of compensating for the gantry errors after the detection operation of FIG. 16 has been performed. In step S1900, the controller 20 receives a set of X-Y coordinates referencing build platen position(s). The set of X-Y coordinates may be a single X-Y coordinate or a plurality of X-Y coordinates.

In step S1910, the controller 20 applies the transformation computed and stored in FIG. 16 (step S1660) to each of the X-Y coordinates in the set. The precise operation to apply the transformation may depend on the nature of the transformation. For example, in the case that the transformation is formed as one or more transformation matrices, the controller 20 may apply these matrices to each X-Y coordinate. In the case that the transformation is formed as individual stored offset amounts for X-Y locations distributed across the gantry, the controller 20 may apply the offset amount of the X-Y location closest to each X-Y coordinate in the set. Alternatively, the controller 20 may, for each X-Y coordinate in the set, interpolate the transformation based on the individual stored offset amounts and their X-Y locations.

The operation of FIG. 19 may be employed in combination with the operations described in FIGS. 3 and 11-13. For instance, the operation of FIG. 19 may be performed to transform every X-Y coordinate reference that arises during the operations in FIGS. 3 and 11-13.

In an alternative embodiment for detecting gantry errors, instead of performing the operation once at a threshold temperature range, the operation of FIG. 16 is performed multiple times while warming up the apparatus 1000 and the reference bed 1400 to multiple different temperatures. As a result, individual transformations are computed over multiple temperatures. To compensate for the gantry errors, the apparatus 1000 may include a temperature sensor to detect the current temperature of the apparatus and/or the build platen. The apparatus 1000 may then select, among the computed transformations, the one that is closest to the detected temperature. Alternatively, the apparatus 1000 may interpolate a specific transformation based on the detected temperature and the plural transformations and corresponding temperatures.

In yet another embodiment for detecting gantry errors, instead of performing step S1610 of warming up the apparatus, the remaining operation of FIG. 16 is performed while detecting the temperature of the apparatus and/or reference bed using a temperature sensor. To compensate for the gantry errors, the apparatus 1000 may detect the current temperature of the apparatus and/or the build platen, and compute a specific transformation using the transformation and temperature from the detection operation, the detected current temperature, and a known coefficient of thermal expansion of the reference bed material.

In still another embodiment for detecting gantry errors, instead of using the laser scanner 15, the apparatus 1000 includes an imaging device to capture an image of the reference bed 1400 from a plurality of X-Y positions. The apparatus 1000 performs image analysis to correlate image changes due to position with expected changes in image position.

In another embodiment, the apparatus 1000 includes encoders (optical or magnetic) with a high level of accuracy to detect actual changes in position. This approach may be used, for example, to detect scaling deviations.

While the above description of the reference bed has been made with respect to grooves, it will be appreciated that any other distinguishable feature may alternatively or additionally be utilized to detect gantry errors without deviating from the invention. For instance, other topographical features, such as projections, may be employed instead of, or in addition to, grooves.

Backlash Detection and Compensation

Yet another aspect of the invention is an apparatus and method for detecting and compensating for backlash errors. It will be appreciated that this aspect may be used in combination with the above-described apparatuses and methods of performing 3D-printing and scanning of an object and the above-described methods of performing gantry error detection and compensation.

Figure 20:
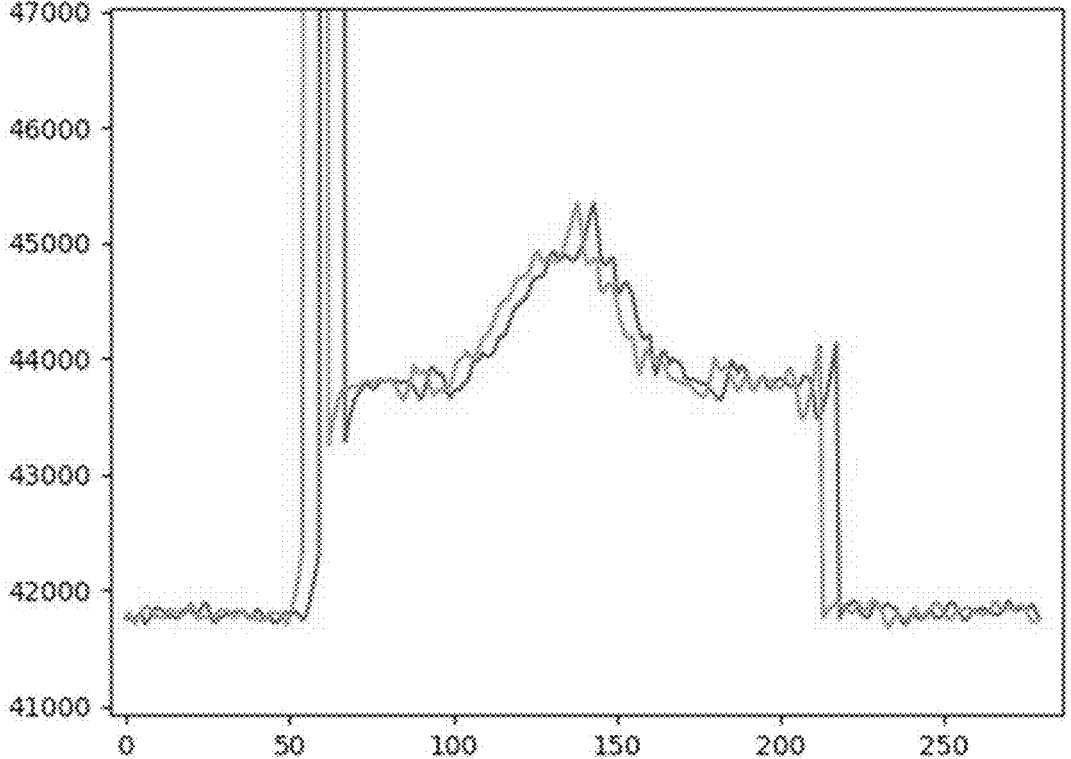
FIG. 20 illustrates a phase shift experienced between forward and reverse scan signals.

One problem that may arise with scanning movement systems is a phase shift between scans in the forward direction and scans in the reverse direction. One cause of such phase shift is a phenomenon known as backlash, which may arise, for example, when components on the head of the scanning movement system do not move precisely coincident with one another (e.g., due to imprecisions or gaps between components). As a result, a delay occurs between initiation of a movement source (e.g., motor) and the actual observed movement in a connected component of interest. Backlash may notably occur when movement starts in a different direction (e.g., opposite direction) from the previous movement direction. One example of such a phase shift is illustrated in FIG. 20, which depicts a difference between scanning measurements when performing a forward-direction scan followed by a backward-direction scan along the same scan path.

Such phase shifts may influence both the measurement and printing operations described above, resulting in inaccuracies in both the scanning process and the printed object. Therefore, a need exists in the art to detect and compensate for such phase shifts, so that the apparatus may perform accurate measurement and printing operations.

The present invention incorporates an operation for detecting and compensating for phase shifts caused by backlash. The present invention also incorporates an operation for performing bidirectional scanning (scanning in both forward and reverse directions) during depth measurements to detect and compensate for phase shifts caused by backlash.

Figure 21:
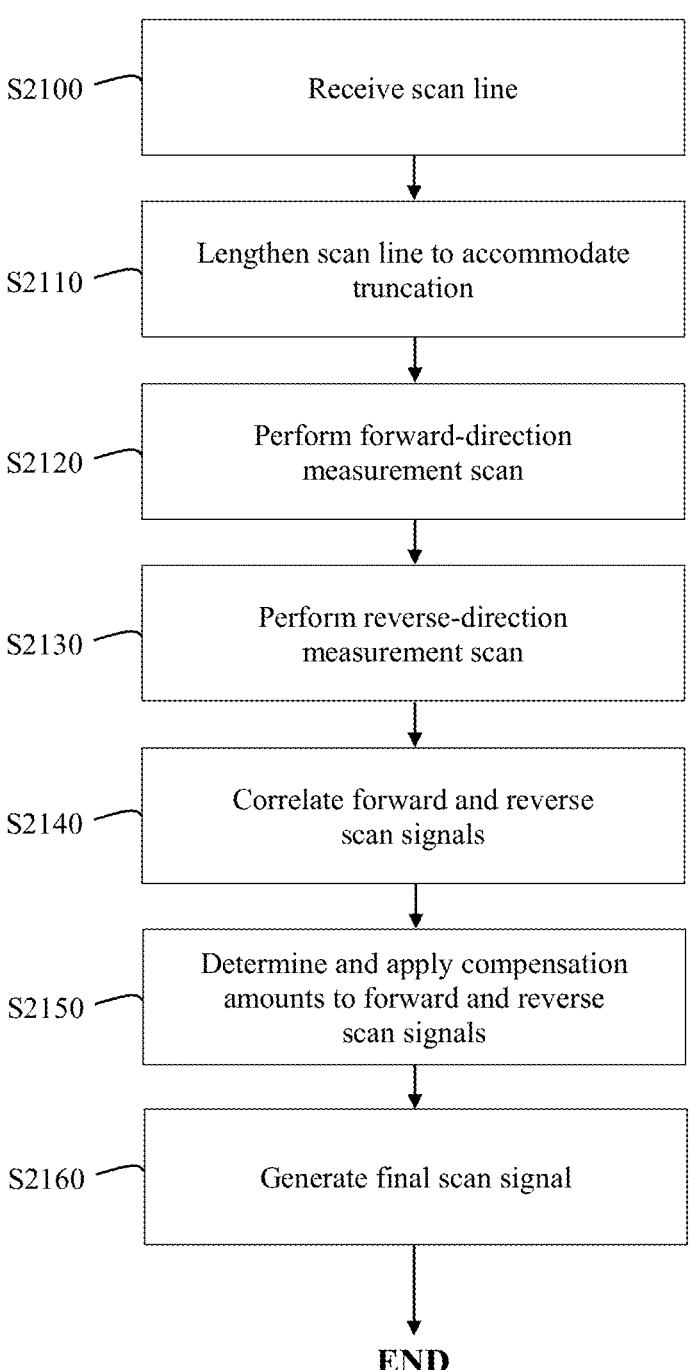
FIG. 21 is a flow chart for detecting and compensating for backlash phase shift, in accordance with one embodiment.

FIG. 21 illustrates an operation for performing a measurement scan in the apparatus that detects and compensates for a backlash phase shift, according to one embodiment. In step S2100, the controller 20 receives a scan path representing continual movement of the print head while performing measurements (e.g., profile scan or edge scan). The scan path may be aligned with the X or Y direction, or may be any path involving a combination of movement in the X and Y directions. The scan path includes a start point where the scan is designated to begin, and an end point where the scan is designated to end. The direction traversing the scan path from the start point to the end point will be understood as a "forward" direction, while the opposite direction traversing the scan path from the end point to the start point will be understood as the "reverse" direction. It is noted that the scan path may at least include any path of movement formed in the scan strategies generated in operations set forth in FIGS. 3 and 11-13.

In step S2110, the controller 20 updates the scan path, lengthening the scan path at each end to include additional segments to be scanned prior to the start point and additional segments to be scanned beyond the end point. The scan segments appended to both ends of the original scan path allow for truncation in a subsequent step. In one embodiment, the combined length of the two appended scan segments exceeds the maximum expected amount of backlash. In one embodiment, the length of each appended scan segment exceeds the maximum expected amount of backlash. The updated scan path includes an updated start point where the updated scan is designated to begin, and an updated end point where the updated scan is designated to end.

In step S2120, the controller 20 causes the laser scanner 15 to perform a measurement scan along the updated scan path in the forward direction. That is, the laser scanner 15 takes depth measurements at intervals along the updated scan path in the forward direction, starting at the updated start point until the updated end point, to produce a forward scan signal.

In step S2130, the controller 20 causes the laser scanner 15 to perform a measurement scan along the updated scan path in the reverse direction. That is, the laser scanner 15 takes depth measurements at intervals along the updated scan path in the reverse direction, starting at the updated end point until the updated start point, to produce a reverse scan signal. At this point, the forward and reverse scan signals may generally correspond to the illustration in FIG. 20, in that a phase shift exists between these two scan signals.

In step S2140, the controller 20 performs a correlation operation between the forward scan signal collected in step S2120 and the reverse scan signal collected in step S2130. The correlation operation reveals the amount of phase shift between the two scan signals. It is understood that known correlation methodologies may be employed in this regard.

In step S2150, the controller 20 determines one or more compensation amounts to adjust the scan signals based on the phase shift amount determined in step S2140. The controller 20 then applies the compensation amounts to the scan signals to shift the scan signals to form compensated scan signals that generally coincide with each other. In one embodiment, a compensated amount is determined to be one-half of the phase shift amount, such that each scan signal is shifted towards the other signal by one-half of the phase shift amount. That is, the forward scan signal is compensated by being shifted in the direction of the reverse scan signal by one-half of the phase shift amount. Conversely, the reverse scan signal is compensated by being shifted in the direction of the forward scan signal by one-half of the phase shift amount.

In step S2160, the controller 20 generates a final scan signal from one or both of the scan signals as compensated in step S2150. For example, the controller 20 may generate a final scan signal by selecting one of the compensated forward scan signal and the compensated reverse scan signal. Alternatively, the controller 20 may generate a final scan signal by combining the compensated forward and reverse scan signals. In addition, the controller 20 may truncate portions of the compensated forward and reverse scan signals corresponding to scan segments appended to the original scan path in step S2110.

It will be appreciated that the measurement operation of FIG. 21 may be applied towards performing any or all of the laser scanner measurements in the operations of FIGS. 3 and 11-13.

Figure 22:
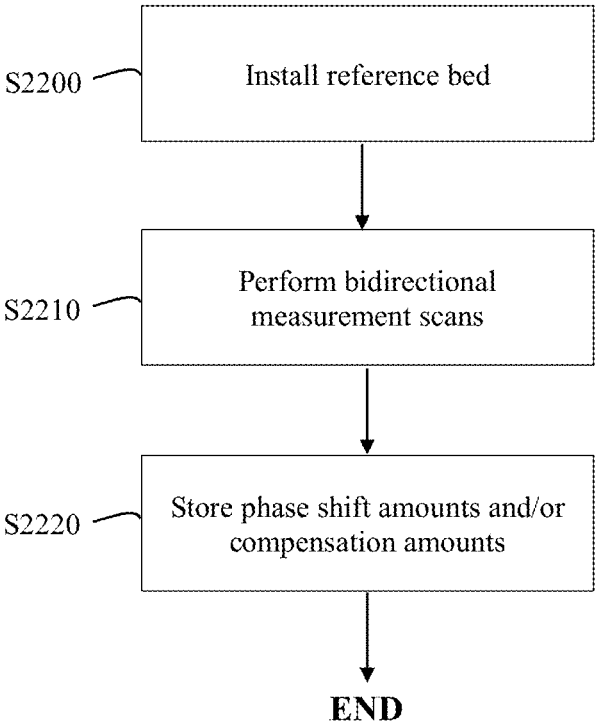
FIG. 22 is a flow chart for detecting backlash phase shift, in accordance with one embodiment.

FIG. 22 illustrates an operation for detecting backlash phase shift in the apparatus, according to another embodiment. In step S2200, an operator installs the reference bed 1400 (described above with respect to gantry error detection) on the apparatus. In one embodiment, the reference bed 1400 temporarily replaces the build platen 16 used during normal operation.

In step S2210, the controller 20 controls the laser scanner 15 to perform a set of bidirectional measurement scans of various scan paths across the reference bed 1400 to obtain phase shift amounts for locations along those scan paths. In one embodiment, the various scan paths are distributed across the surface of the reference bed 1400 and cover a variety of locations on the reference bed 1400 in a variety of different directions. This step may employ various above-described steps from the FIG. 21 operation to obtain the phase shift amounts.

Figure 23:
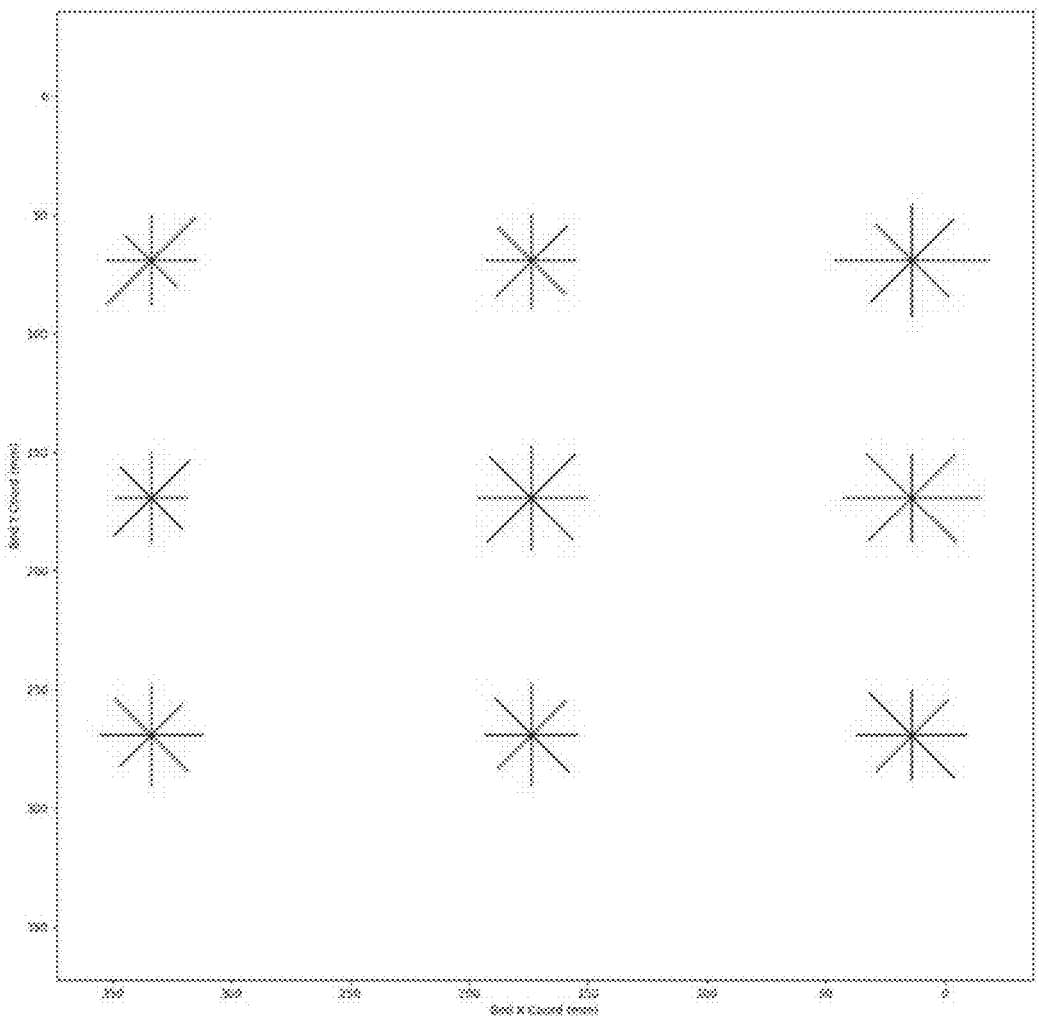
FIG. 23 illustrates a representation of phase shift amounts or compensation amounts based on location and scan direction.

In step S2220, the controller 20 stores, in the memory 21, the phase shift amounts (and/or compensation amounts determined from the phase shift amounts) corresponding to the various locations and scan path directions from step S2210. In one embodiment, the stored information may be represented by the illustration in FIG. 23, which depicts nine locations, each with compensation amounts for eight scan directions. In particular, the length of each "lash" extending from a location in a particular scan direction represents the magnitude of phase shift or compensation amount. Of course, it will be appreciated that any number of locations and scan directions may be employed in connection with this operation. It will also be appreciated that another object other than the reference bed may be used for this operation.

Figure 24:
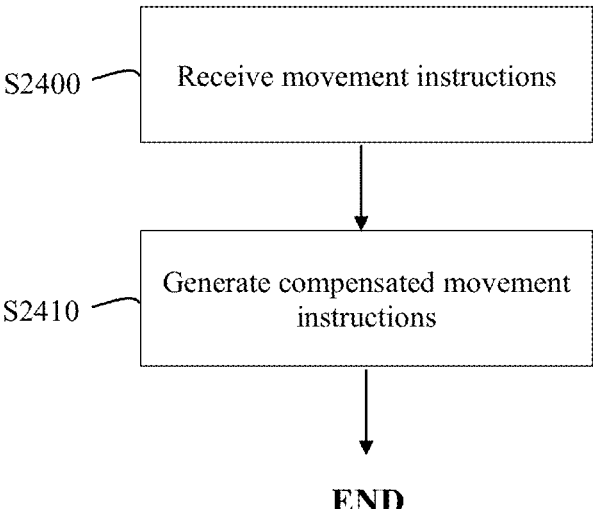
FIG. 24 is a flow chart for compensating for backlash phase shift, in accordance with one embodiment.

FIG. 24 illustrates an operation for compensating for backlash phase shift in the apparatus, according to another embodiment. This operation is utilized after the FIG. 22 operation of detecting backlash phase shift has already been performed. In step S2400, the controller 20 receives movement instructions relating to travel of the print head(s) 10, 18. The movement instructions may include print instructions defining print head travel during production of a print layer, or scanning instructions from a scan strategy defining print head travel for conducting a measurement scan.

In step S2410, the controller 20 generates compensated movement instructions based on the stored phase shift amounts or compensation amounts in step S2220. In one embodiment, the compensated movement instructions are generated by utilizing the compensation amounts corresponding to the closest stored location (and relevant scan directions) to the print head travel. In one embodiment, the compensated movement instructions are generated by interpolating the compensation amounts of multiple stored locations (and relevant scan directions). In this regard, the compensated movement instructions will counteract the backlash effects encountered during the print head movement.

The operation of FIG. 24 may be employed in combination with the operations described in FIGS. 3 and 11-13. For instance, the operation of FIG. 24 may be performed to compensate for backlash during movement of the print head when performing printing, during the operations in FIGS. 3 and 11-13.

In one embodiment, a common compensation amount is applied irrespective of location and movement direction. The corresponding operation for detecting backlash phase shift may involve a bidirectional scan in any arbitrary location and/or reciprocating direction.

In one embodiment, a compensation amount is applied based on the specific movement direction, but irrespective of location. The corresponding operation for detecting backlash phase shift may involve a bidirectional scan in any arbitrary location, performed over a series of reciprocating directions. For instance, the compensation amount may be determined based on a common compensation amount adjusted by a factor that depends on movement direction.

In one embodiment, a compensation is applied based on the specific location, but irrespective of movement direction. The corresponding operation for detecting backlash phase shift may involve a bidirectional scan in any arbitrary reciprocating direction, performed over a series of locations. For instance, the compensation amount may be determined based on a common compensation amount adjusted by a factor that depends on location.

In one embodiment, a compensation is applied based on both the specific location and movement direction. The corresponding operation for detecting backlash phase shift may involve bidirectional scans performed over a series of locations and over a series of reciprocating directions. For instance, the compensation amount may be determined based on a common compensation amount adjusted by a factor that depends on location and movement direction.

In one embodiment, a compensation is applied based on both the specific movement direction and the movement speed. The corresponding operation for detecting backlash phase shift may involve bidirectional scans performed over a series of reciprocating directions and over a series of movement speeds. For instance, the compensation amount may be determined based on a common compensation amount adjusted by a factor that depends on movement direction and movement speed.

Incorporation by reference is hereby made to U.S. Pat. Nos. 10,076,876, 9,149,988, 9,579,851, 9,694,544, 9,370, 896, 9,539,762, 9,186,846, 10,000,011, 10,464,131, U.S. Patent Application Publication No. 2016/0107379, U.S. Patent Application Publication No. 2018/0154439, U.S. Patent Application Publication No. 2018/0154580, and U.S. Patent Application Publication No. 2018/0154437 in their entireties.

Although this invention has been described with respect to certain specific exemplary embodiments, many additional modifications and variations will be apparent to those skilled in the art in light of this disclosure. For instance, while reference has been made to an X-Y Cartesian coordinate system, it will be appreciated that the aspects of the invention may be applicable to other coordinate system types (e.g., radial). It is, therefore, to be understood that this invention may be practiced otherwise than as specifically described. Thus, the exemplary embodiments of the invention should be considered in all respects to be illustrative and not restrictive, and the scope of the invention to be determined by any claims supportable by this application and the equivalents thereof, rather than by the foregoing description.

What is claimed is:

1. A method of correcting positioning errors in a system that includes a movement component, comprising:

detecting a plurality of topographical features positioned at different locations on the surface of a reference object disposed within the system;

comparing a location of the detected topographical features to expected locations for the topographical features;

generating transformation information based on the comparison; and correcting movement instructions of the movement component based on the generated transformation information, the corrected movement instructions relating to an object different from the reference object, wherein the comparing step includes, for each detected topographical feature:

determining a portion of the respective topographical feature as a left-side portion, determining a portion of the respective topographical feature as a right-side portion, determining the location of the center of the respective topographical feature based on the determined left-side portion and the determined right-side portion, and comparing the location of the center of the respective topographical feature to the expected location for the topographical feature, and wherein the location of the center of the respective topographical feature is determined based on the intersection of the determined left-side portion and the determined right-side portion.

2. A method of correcting positioning errors in a system that includes a movement component, comprising:

detecting a plurality of topographical features positioned at different locations on the surface of a reference object disposed within the system;

comparing a location of the detected topographical features to expected locations for the topographical features;

generating transformation information based on the comparison; and correcting movement instructions of the movement component based on the generated transformation information, the corrected movement instructions relating to an object different from the reference object, wherein the comparing step includes, for each detected topographical feature:

determining a portion of the respective topographical feature as a left-side portion, determining a portion of the respective topographical feature as a right-side portion, determining the location of the center of the respective topographical feature based on the determined left-side portion and the determined right-side portion, and comparing the location of the center of the respective topographical feature to the expected location for the topographical feature, and wherein the location of the center of the respective topographical feature is determined based on the intersection of a regression performed based on the determined left-side portion and a regression performed based on the determined right-side portion.

3. The method of claim 2, wherein the topographical features includes grooves.

4. The method of claim 3, wherein the grooves are V-shaped.

5. The method of claim 2, wherein the detecting of the plurality of topographical features includes detecting the topographical features with a laser scanner.

6. The method of claim 2, wherein the movement component is a gantry providing movement in the X and Y directions.

7. The method of claim 2, wherein the topographical features are arranged in a grid pattern.

* * * * *